(12) United States Patent
Akae et al.

(10) Patent No.: US 8,809,204 B2
(45) Date of Patent: Aug. 19, 2014

(54) METHOD OF MANUFACTURING SEMICONDUCTOR DEVICE AND SUBSTRATE PROCESSING APPARATUS

(71) Applicant: Hitachi Kokusai Electric, Inc., Toyama (JP)

(72) Inventors: Naonori Akae, Toyama (JP); Yoshiro Hirose, Toyama (JP); Yushin Takasawa, Toyama (JP); Yosuke Ota, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 13/666,272

(22) Filed: Nov. 1, 2012

(65) Prior Publication Data
US 2013/0059451 A1 Mar. 7, 2013

Related U.S. Application Data

(63) Continuation of application No. 12/607,223, filed on Oct. 28, 2009, now Pat. No. 8,367,557.

(30) Foreign Application Priority Data

Oct. 29, 2008 (JP) ................................ 2008-278089
Jul. 30, 2009 (JP) ................................ 2009-178309

(51) Int. Cl.
H01L 21/314 (2006.01)
C23C 16/455 (2006.01)
H01L 21/316 (2006.01)
H01L 21/318 (2006.01)

(52) U.S. Cl.
CPC .............................. C23C 16/45512 (2013.01)
USPC .... 438/770; 438/773; 438/787; 257/E21.283; 257/E21.285

(58) Field of Classification Search
CPC ................................ C23C 16/45512–16/45574
USPC ......... 438/263–264, 503, 507, 585, 591, 594, 438/758, 765, 769, 770–772, 778, 784, 438/786–787, 790, 954; 257/632, 646, 257/E21.625, E21.639, E21.082, 257/E21.283–E21.285, E21.301
See application file for complete search history.

(56) References Cited

U.S. PATENT DOCUMENTS 6,313,047 B2 * 11/2001 Hasebe et al. ................ 438/785
6,323,115 B1    11/2001 Tanabe et al.
(Continued)

FOREIGN PATENT DOCUMENTS

JP    02-004973      1/1990
JP    2004006699     1/2004
(Continued)

Primary Examiner — Laura Menz
Assistant Examiner — Maliheh Malek
(74) Attorney, Agent, or Firm — Volpe and Koenig, P.C.

(57) ABSTRACT

A method of manufacturing a semiconductor device, the method comprising: forming an oxide film on a substrate by alternately repeating: (a) forming an element-containing layer on the substrate by supplying a source gas containing an element into a process vessel accommodating the substrate; and (b) changing the element-containing layer to an oxide layer by supplying an oxygen-containing gas and a hydrogen-containing gas into the process vessel having an inside pressure lower than atmospheric pressure, reacting the oxygen-containing gas with the hydrogen-containing gas to generate an atomic oxygen, and oxidizing the element-containing layer by the atomic oxygen.

25 Claims, 16 Drawing Sheets

(56) References Cited

U.S. PATENT DOCUMENTS

| | | | |
|---|---|---|---|
| 6,503,819 B2 | 1/2003 | Tanabe et al. | |
| 6,528,403 B2 | 3/2003 | Tanabe et al. | |
| 6,534,395 B2 | 3/2003 | Werkhoven et al. | |
| 6,653,212 B1 | 11/2003 | Yamanaka et al. | |
| 6,861,334 B2 | 3/2005 | Raaijmakers et al. | |
| 6,962,876 B2 | 11/2005 | Ahn et al. | |
| 6,992,019 B2 | 1/2006 | Lee et al. | |
| 7,084,076 B2 | 8/2006 | Park et al. | |
| 7,101,760 B1 | 9/2006 | Lojek | |
| 7,148,106 B2 | 12/2006 | Joo et al. | |
| 7,419,888 B2 | 9/2008 | Yang et al. | |
| 7,442,656 B2 | 10/2008 | Matsuura | |
| 7,625,609 B2 | 12/2009 | Matsuura | |
| 7,713,883 B2 | 5/2010 | Yuasa et al. | |
| 7,754,293 B2 * | 7/2010 | Aoyama et al. | 427/553 |
| 7,825,039 B2 * | 11/2010 | Takahashi et al. | 438/778 |
| 7,981,791 B2 | 7/2011 | Haukka et al. | |
| 8,084,369 B2 * | 12/2011 | Ozaki et al. | 438/770 |
| 8,202,809 B2 * | 6/2012 | Ota et al. | 438/788 |
| 8,252,701 B2 * | 8/2012 | Sasajima et al. | 438/774 |
| 2001/0041250 A1 | 11/2001 | Werkhoven et al. | |
| 2002/0028567 A1 * | 3/2002 | Aruga et al. | 438/488 |
| 2002/0068466 A1 | 6/2002 | Lee et al. | |
| 2002/0081801 A1 | 6/2002 | Forster et al. | |
| 2002/0164890 A1 | 11/2002 | Kwan et al. | |
| 2002/0182893 A1 * | 12/2002 | Ballantine et al. | 438/795 |
| 2003/0015764 A1 | 1/2003 | Raaijmakers et al. | |
| 2003/0032281 A1 | 2/2003 | Werkhoven et al. | |
| 2003/0113971 A1 | 6/2003 | Nagaoka et al. | |
| 2004/0018694 A1 | 1/2004 | Lee et al. | |
| 2004/0077184 A1 | 4/2004 | Anderson et al. | |
| 2004/0086640 A1 | 5/2004 | Luo et al. | |
| 2004/0180557 A1 | 9/2004 | Park et al. | |
| 2005/0136693 A1 | 6/2005 | Hasebe et al. | |
| 2005/0239297 A1 | 10/2005 | Senzaki et al. | |
| 2005/0276922 A1 | 12/2005 | Bernhardt et al. | |
| 2006/0032442 A1 | 2/2006 | Hasebe | |
| 2006/0040510 A1 | 2/2006 | Lee et al. | |
| 2006/0166467 A1 | 7/2006 | Witvrouw et al. | |
| 2006/0211243 A1 | 9/2006 | Ishizaka et al. | |
| 2006/0225657 A1 | 10/2006 | Mizushima et al. | |
| 2006/0264062 A1 * | 11/2006 | Ingle et al. | 438/763 |
| 2006/0281337 A1 * | 12/2006 | Matsuura | 438/787 |
| 2007/0066083 A1 | 3/2007 | Yang et al. | |
| 2007/0071894 A1 * | 3/2007 | Mieno | 427/248.1 |
| 2007/0082507 A1 * | 4/2007 | Iyer et al. | 438/795 |
| 2007/0221968 A1 | 9/2007 | Park | |
| 2008/0090354 A1 | 4/2008 | Baek et al. | |
| 2008/0124946 A1 | 5/2008 | Xiao et al. | |
| 2008/0282976 A1 | 11/2008 | Okada et al. | |
| 2009/0042404 A1 | 2/2009 | Surthi | |
| 2009/0047798 A1 | 2/2009 | Clark et al. | |
| 2009/0087964 A1 | 4/2009 | Maeda et al. | |
| 2009/0104792 A1 | 4/2009 | Miya et al. | |
| 2009/0130829 A1 | 5/2009 | Noda et al. | |
| 2009/0170345 A1 | 7/2009 | Akae et al. | |
| 2009/0242969 A1 | 10/2009 | Tanaka | |
| 2009/0267134 A1 | 10/2009 | Koike et al. | |
| 2009/0305517 A1 | 12/2009 | Nakashima et al. | |
| 2010/0055927 A1 | 3/2010 | Hirose et al. | |
| 2010/0124621 A1 | 5/2010 | Kobayashi et al. | |
| 2010/0130024 A1 | 5/2010 | Takasawa et al. | |
| 2010/0173501 A1 | 7/2010 | Miya et al. | |
| 2010/0190348 A1 | 7/2010 | Akae et al. | |
| 2010/0289070 A1 | 11/2010 | Tran | |
| 2011/0076857 A1 | 3/2011 | Akae et al. | |
| 2011/0124204 A1 | 5/2011 | Ota et al. | |
| 2011/0130011 A1 | 6/2011 | Sasajima et al. | |
| 2011/0136343 A1 | 6/2011 | Wang et al. | |
| 2011/0183528 A1 | 7/2011 | Wang et al. | |
| 2011/0189862 A1 | 8/2011 | Honda et al. | |
| 2012/0034788 A1 * | 2/2012 | Sakai et al. | 438/758 |
| 2013/0084712 A1 * | 4/2013 | Yuasa et al. | 438/763 |
| 2013/0280919 A1 * | 10/2013 | Yuasa et al. | 438/778 |

FOREIGN PATENT DOCUMENTS

| | | |
|---|---|---|
| JP | 2006-054432 | 2/2006 |
| JP | 2006-054432 A | 2/2006 |
| JP | 2006-066587 A | 3/2006 |
| JP | 2006-190787 A | 7/2006 |
| JP | 2008-075166 | 4/2008 |
| KR | 10-2008-0025083 | 3/2008 |
| WO | 2007/083651 A1 | 7/2007 |
| WO | 2007083651 | 7/2007 |

* cited by examiner

<Prior Art>

<Prior Art>

<Prior Art>

METHOD OF MANUFACTURING SEMICONDUCTOR DEVICE AND SUBSTRATE PROCESSING APPARATUS

CROSS-REFERENCE TO RELATED PATENT APPLICATION

This application is a continuation of U.S. patent application Ser. No. 12/607,223, filed Oct. 28, 2009, which claims priority under 35 U.S.C. 119 to Japanese Patent Application Nos. 2008-278089, filed on Oct. 29, 2008, and 2009-178309, filed Jul. 30, 2009, in the Japanese Patent Office, the entire contents of which are hereby incorporated by reference.

BACKGROUND OF THE INVENTION

1. Field of the Invention

The present invention relates to a method of manufacturing a semiconductor device, which includes a process of forming a thin film on a substrate, and a substrate processing apparatus.

2. Description of the Prior Art

A flash memory includes an electron accumulation region (floating gate) surrounded by an insulation film, and its operation principle is to perform a data write operation by exchange of electrons through a thin tunnel oxide film and to retain the electrons and keep memorized data for a long time by using insulation property of the thin tunnel oxide film. Even though no operation from the outside is performed, data stored in a flash memory may need to be retained as long as ten years, and a requirement for an insulation film surrounding a charge accumulation region, called a floating gate, is strict. In an interlayer dielectric film disposed between the floating gate and a control gate designed to control a memory cell operation, a stacked structure of oxide film ($SiO_2$)/nitride film ($Si_3N_4$)/oxide film ($SiO_2$), generally called ONO, is used and it is expected to have a high leakage current characteristic.

Conventionally, the formation of an $SiO_2$ insulation film in an ONO stacked structure has been performed at a high temperature around 800° C. through a Chemical Vapor Deposition (CVD) process by using an $SiH_2Cl_2$ gas and an $N_2O$ gas. However, since the device is further scaled down and the capacity of the nitride film among the ONO stacked films is lowered, the adoption of a high dielectric constant film instead of the nitride film has been considered in order for ensuring capacity. To suppress crystallization of the high dielectric constant film, it is necessary to form an $SiO_2$ insulation film formed on the high dielectric constant film at a temperature lower than a forming temperature of the high dielectric constant film.

In the case of forming the $SiO_2$ insulation film, as its forming temperature is lowered, atoms other than silicon (Si) and oxygen (O) contained in a source used for film formation may remain as impurities within the film. Hence, in the case of forming the $SiO_2$ insulation film at a low temperature by using an organic source gas, there has been a problem that carbon (C), hydrogen (H), nitrogen (N) and so on contained in organic source gas molecules remain as impurities within the $SiO_2$ insulation layer.

In addition, in the case of using an inorganic source gas, there has been a problem that hydrogen (H), chlorine (Cl) and so on contained in a source remain as impurities within the film. Since such impurities significantly degrade the film quality of the formed insulation film, there is a need for a technology that can form a high-quality insulation film having a low within-film impurity concentration at a low temperature.

SUMMARY OF THE INVENTION

An object of the present invention is to provide a method of manufacturing a semiconductor device and a substrate processing apparatus, which are capable of solving the above-described problems and forming an insulation film having extremely low impurity concentrations of carbon, hydrogen, nitrogen, chlorine and so on contained within the film at a low temperature.

According to an aspect of the present invention, there is provided a method of manufacturing a semiconductor device, the method including: forming an oxide film on a substrate by alternately repeating: (a) forming an element-containing layer on the substrate by supplying a source gas containing an element into a process vessel accommodating the substrate; and (b) changing the element-containing layer to an oxide layer by supplying an oxygen-containing gas and a hydrogen-containing gas into the process vessel having an inside pressure lower than atmospheric pressure, reacting the oxygen-containing gas with the hydrogen-containing gas to generate oxidizing species containing oxygen, and oxidizing the element-containing layer by the oxidizing species.

According to another aspect of the present invention, there is provided a method of manufacturing a semiconductor device, the method including: forming an oxide film on a substrate by alternately repeating: (a) forming an element-containing layer on the substrate by supplying a source gas containing an element into a process vessel accommodating the substrate; and (b) changing the element-containing layer to an oxide layer by supplying an oxygen-containing gas and a hydrogen-containing gas into the process vessel having an inside pressure lower than atmospheric pressure, reacting the oxygen-containing gas with the hydrogen-containing gas to generate oxidizing species containing oxygen, and oxidizing the element-containing layer by the oxidizing species, wherein the hydrogen-containing gas is supplied into the process vessel together with the source gas in the step (a).

According to another aspect of the present invention, there is provided a substrate processing apparatus including: a process vessel configured to accommodate a substrate; a heater configured to heat the inside of the process vessel; a source gas supply system configured to supply source gas containing a predetermined element into the process vessel; an oxygen-containing gas supply system configured to supply oxygen gas or ozone gas as the oxygen-containing gas into the process vessel; a hydrogen-containing gas supply system configured to supply hydrogen gas or deuterium gas as the hydrogen-containing gas into the process vessel; a pressure regulation unit configured to regulate pressure inside the process vessel; and a controller configured to control the source gas supply system, the oxygen-containing gas supply system, the hydrogen-containing gas supply system, the pressure regulation unit, and the heater so that an oxide film having a predetermined film thickness is formed on the substrate by repeating a process of forming a predetermined element-containing layer on the substrate by supplying the source gas into the process vessel accommodating the substrate, and a process of changing the predetermined element-containing layer to an oxide layer by supplying the oxygen-containing gas and the hydrogen-containing gas into the process vessel that is set below atmospheric pressure, and so that the temperature of the substrate is set in a range from 400° C. or more to 700° C. or less when forming the oxide film.

BRIEF DESCRIPTION OF THE DRAWINGS

FIG. 4A illustrates an example of intermittently supplying $H_2$ gas, and FIG. 4B illustrates an example of continuously supplying $H_2$ gas.

DETAILED DESCRIPTION OF THE PREFERRED EMBODIMENTS

Figure 1:
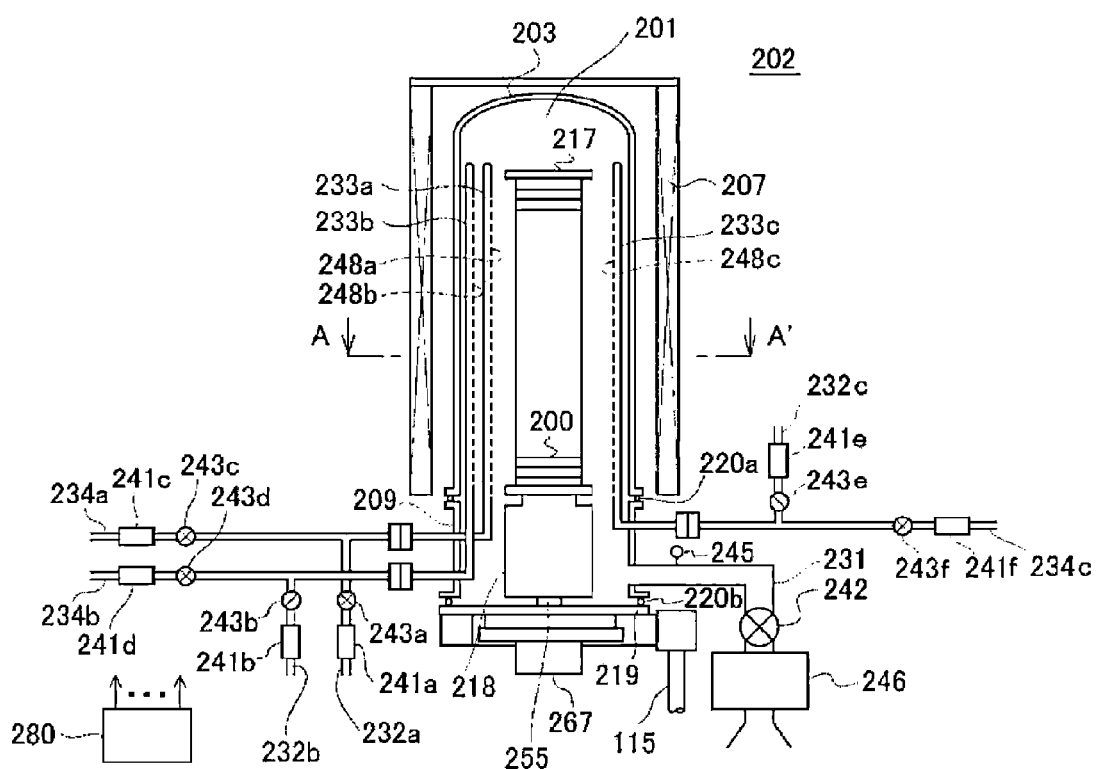
FIG. 1 is a schematic configuration diagram of a vertical type process furnace of a substrate processing apparatus that is preferably used in an embodiment of the present invention, specifically illustrating a longitudinal sectional view of the process furnace.

Conventionally, organic-based sources have been used to form an oxide film at a low temperature, but the inventors have been devoted to research on methods of forming an oxide film at a low temperature by using inorganic-based sources. As a result, the inventors found out that, when a process of forming a source adsorption layer or a predetermined element layer (hereinafter, referred to as a predetermined element-containing layer) on a substrate by supplying a source gas containing a predetermined element into the process vessel accommodating the substrate, and a process of changing the predetermined element-containing layer formed on the substrate to an oxide layer by supplying an oxygen-containing gas and a hydrogen-containing gas into the process vessel that was set below the atmospheric pressure were defined as 1 cycle, a silicon oxide film having a predetermined film thickness could be formed on the substrate by performing the cycle at least one or more times. Herein, the source adsorption layer includes a discontinuous adsorption layer as well as a continuous adsorption layer of source molecules. The predetermined element layer includes a discontinuous layer as well as a continuous layer made of a predetermined element, or a thin film formed by their overlapping. Meanwhile, the continuous layer made of the predetermined element might be called a thin film.

The process of forming the predetermined element-containing layer (source adsorption layer or predetermined element layer) on the substrate is performed under a condition where a CVD reaction occurs, and, at this time, the predetermined element-containing layer is formed in a range of less than 1 atomic layer to several atomic layers. Meanwhile, the layer of less than 1 atomic layer refers to an atomic layer formed discontinuously.

Also, in the process of changing the predetermined element-containing layer to the oxide layer, an oxidizing species containing oxygen is generated by reaction of the oxygen-containing gas and the hydrogen-containing gas at the inside of the process vessel that is set under a pressure atmosphere less than the atmospheric pressure, and the predetermined element-containing layer is oxidized by the oxidizing species and changed to the oxide layer. Such an oxidation process may remarkably improve oxidizing power, compared with the case of supplying the oxygen-containing gas alone. That is, compared with the case of supplying the oxygen-containing gas alone, the remarkably improvement effect of the oxidizing power may be obtained by adding the hydrogen-containing gas to the oxygen-containing gas under a depressurized atmosphere. The process of changing the predetermined element-containing layer to the oxide layer is performed under a depressurized atmosphere of non-plasma.

It was ascertained that if the oxide film was formed by the above-described method, the film-forming rate and the within-substrate film thickness uniformity were excellent, compared with the case of film formation by the CVD method using the organic-based sources.

Furthermore, it was ascertained that the within-film impurity concentration of the oxide film formed by the above-described method was extremely lowered, compared with the case of film formation by the CVD method using the organic-based sources. Moreover, it was ascertained that the above-described method was excellent in the film-forming rate, the within-substrate film thickness uniformity, and the within-film impurity concentration, even though the organic-based source was used.

The present invention was made based on the findings the inventors obtained. Hereinafter, an embodiment of the present invention will be described with reference to the drawings.

Figure 2:
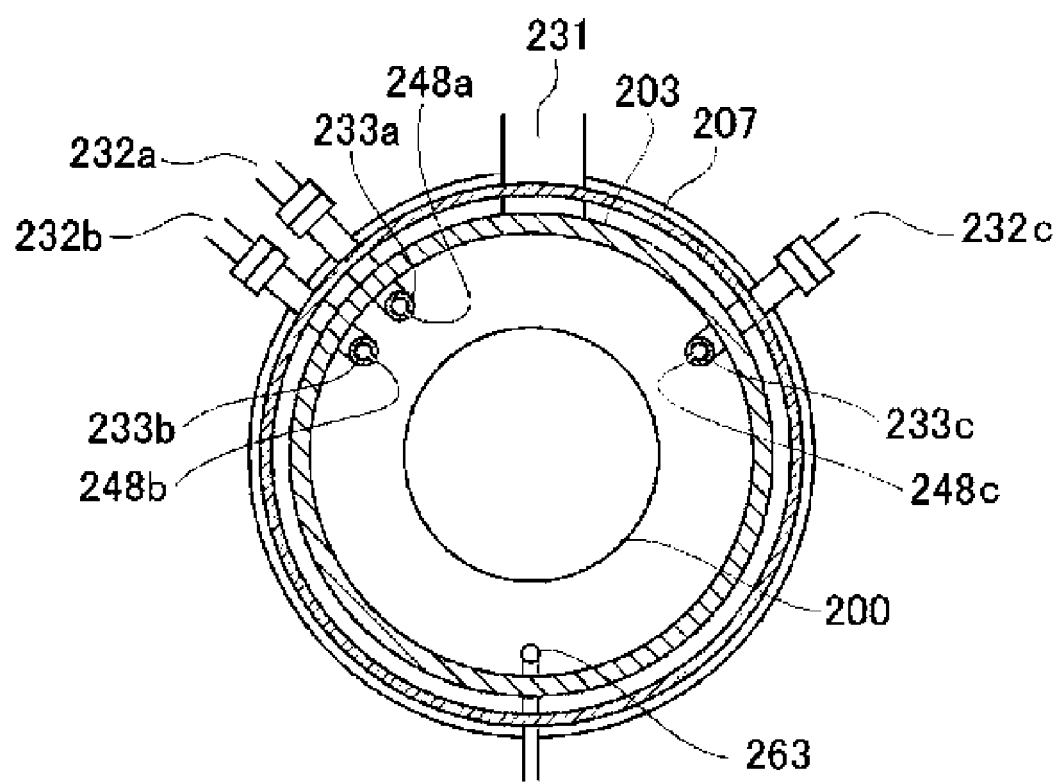
FIG. 2 is a schematic configuration view of the vertical type process furnace of the substrate processing apparatus that is preferably used in the embodiment of the present invention, specifically illustrating an A-A' sectional view of the process furnace illustrated in FIG. 1.

FIG. 1 is a schematic configuration diagram of a vertical type process furnace of a substrate processing apparatus that is preferably used in an embodiment of the present invention. Specifically, FIG. 1 is a longitudinal sectional view illustrating a portion of the process furnace 202. Also, FIG. 2 is an A-A' sectional view of the process furnace illustrated in FIG. 1. Meanwhile, the present invention is not limited to the substrate processing apparatus in accordance with the current embodiment, but may also be preferably applied to a substrate processing apparatus having a single wafer type process furnace, a hot wall type process furnace, or a cold wall type process furnace.

As illustrated in FIG. 1, the process furnace 202 is provided with a heater 207 as a heating unit (heating mechanism). The heater 207 is cylindrically shaped and is vertically installed in such a manner that it is supported on a heater base (not shown) used as a holding plate.

At the inside of the heater 207, a process tube 203 as a reaction tube is installed concentrically with the heater 207. The process tube 203 is made of, for example, a heat-resistant material such as quartz ($SiO_2$) or silicon carbide (SiC), and is formed in a cylindrical shape with a closed top end and an opened bottom end. At a hollow part of the process tube 203, a process chamber 201 is formed. The process chamber 201 is configured to accommodate wafers 200 as substrates which are horizontally positioned and vertically arranged in multiple stages by a boat 217 as described later.

At the lower side of the process tube 203, a manifold 209 is installed concentrically with the process tube 203. The manifold 209 is made of, for example, stainless steel or the like and is formed in a cylindrical shape with opened top and bottom ends. The manifold 209 is engaged with the process tube 203 and installed to support the process tube 203. In addition, an O-ring 220a used as a seal member is installed between the manifold 209 and the process tube 203. Since the manifold 209 is supported on a header base, the process tube 203 is in a vertically fixed state. A reaction vessel (process vessel) is configured by the process tube 203 and the manifold 209.

At the manifold 209, a first nozzle 233a as a first gas introduction unit, a second nozzle 233b as a second gas introduction unit, and a third nozzle 233c as a third gas introduction unit are installed to pass through a sidewall of the manifold 209. A first gas supply pipe 232a, a second gas supply pipe 232b, and a third gas supply pipe 232c are connected to the first nozzle 233a, the second nozzle 233b, and the third nozzle 233c, respectively. In this manner, three gas supply pipes are installed as gas supply passages to supply a plurality of kinds of process gases, for example, three kinds of process gases into the process chamber 201.

At the first gas supply pipe 232a, a mass flow controller 241a used as a flow rate controller (flow rate control unit) and a valve 243a used as an on-off valve are sequentially installed from the upstream direction. Furthermore, at the more downstream side than the valve 243a of the first gas supply pipe 232a, a first inert gas supply pipe 234a configured to supply inert gas is connected. At the first inert gas supply pipe 234a, a mass flow controller 241c used as a flow rate controller (flow rate control unit) and a valve 243c used as an on-off valve are sequentially installed from the upstream direction. Moreover, at the leading end of the first gas supply pipe 232a, the first nozzle 233a described above is connected. The first nozzle 233a is installed upright in the upward stacking direction of the wafers 200, from the lower part to the upper part of the inner wall of the process tube 203, in a space having a circular arc shape between the wafer 200 and the inner wall of the process tube 203 constituting the process chamber 201. In the side surface of the first nozzle 233a, gas supply holes 248a through which gas is supplied are installed. The gas supply holes 248a formed from the lower part to the upper part have the same opening area and are installed at the same pitches. A first gas supply system may be mainly configured by the first gas supply pipe 232a, the mass flow controller 241a, the valve 243a, and the first nozzle 233a, and a first inert gas supply system is mainly configured by the first inert gas supply pipe 234a, the mass flow controller 241c, and the valve 243c.

At the second gas supply pipe 232b, a mass flow controller 241b used as a flow rate controller (flow rate control unit) and a valve 243b used as an on-off valve are sequentially installed from the upstream direction.

Furthermore, at the more downstream side than the valve 243b of the second gas supply pipe 232b, a second inert gas supply pipe 234b configured to supply inert gas is connected. At the second inert gas supply pipe 234b, a mass flow controller 241d used as a flow rate controller (flow rate control unit) and a valve 243d used as an on-off valve are sequentially installed from the upstream direction. Moreover, at the leading end of the second gas supply pipe 232b, the second nozzle 233b described above is connected. The second nozzle 233b is installed upright in the upward stacking direction of the wafers 200, from the lower part to the upper part of the inner wall of the process tube 203, in a space having a circular arc shape between the wafer 200 and the inner wall of the process tube 203 constituting the process chamber 201. In the side surface of the second nozzle 233b, gas supply holes 248b through which gas is supplied are installed. The gas supply holes 248b formed from the lower part to the upper part have the same opening area and are installed at the same pitches. A second gas supply system may be mainly configured by the second gas supply pipe 232b, the mass flow controller 241b, the valve 243b, and the second nozzle 233b, and a second inert gas supply system is mainly configured by the second inert gas supply pipe 234b, the mass flow controller 241d, and the valve 243d.

At the third gas supply pipe 232c, a mass flow controller 241e used as a flow rate controller (flow rate control unit) and a valve 243e used as an on-off valve are sequentially installed from the upstream direction.

Furthermore, at the more downstream side than the valve 243e of the third gas supply pipe 232c, a third inert gas supply pipe 234c configured to supply inert gas is connected. At the third inert gas supply pipe 234c, a mass flow controller 241f used as a flow rate controller (flow rate control unit) and a valve 243f used as an on-off valve are sequentially installed from the upstream direction. Moreover, at the leading end of the third gas supply pipe 232c, the third nozzle 233c described above is connected. The third nozzle 233c is installed upright in the upward stacking direction of the wafers 200, from the lower part to the upper part of the inner wall of the process tube 203, in a space having a circular arc shape between the wafer 200 and the inner wall of the process tube 203 constituting the process chamber 201. In the side surface of the third nozzle 233c, gas supply holes 248c through which gas is supplied are installed. The gas supply holes 248c formed from the lower part to the upper part have the same opening area and are installed at the same pitches. A third gas supply system may be mainly configured by the third gas supply pipe 232c, the mass flow controller 241e, the valve 243e, and the third nozzle 233c, and a third inert gas supply system is mainly configured by the third inert gas supply pipe 234c, the mass flow controller 241f, and the valve 243f.

Gas containing oxygen (oxygen-containing gas), for example, oxygen ($O_2$) gas, is supplied into the process chamber 201 from the first gas supply pipe 232a through the mass flow controller 241a, the valve 243a, and the first nozzle 233a. That is, the first gas supply system is configured as an oxygen-containing gas supply system. In this case, at the same time, inert gas may be supplied into the first gas supply pipe 232a from the first inert gas supply pipe 234a through the mass flow controller 241c and the valve 243c.

In addition, gas containing hydrogen (hydrogen-containing gas), for example, hydrogen ($H_2$) gas, is supplied into the process chamber 201 from the second gas supply pipe 232b through the mass flow controller 241b, the valve 243b, and the second nozzle 233b. That is, the second gas supply system is configured as a hydrogen-containing gas supply system. In this case, at the same time, inert gas may be supplied into the second gas supply pipe 232b from the second inert gas supply pipe 234b through the mass flow controller 241d and the valve 243d.

Furthermore, source gas, that is, gas containing silicon as a predetermined element (silicon-containing gas), for example, hexachlorodisilane ($Si_2Cl_6$, abbreviated to HCD) gas, is supplied into the process chamber 201 from the third gas supply pipe 232c through the mass flow controller 241e, the valve 243e, and the third nozzle 233c. That is, the third gas supply system is configured as a source gas supply system (silicon-containing gas supply system). In this case, at the same time, inert gas may be supplied into the third gas supply pipe 232c from the third inert gas supply pipe 234c through the mass flow controller 241f and the valve 243f.

Meanwhile, in the current embodiment, the $O_2$ gas, the $H_2$ gas, and the HCD gas are supplied into the process chamber 201 through the different nozzles, but, for example, the $H_2$ gas and the HCD gas may be supplied into the process chamber 201 through the same nozzle. In addition, the $O_2$ gas and the $H_2$ gas may be supplied into the process chamber 201 through the same nozzle. As such, if the nozzle is commonly used for a plurality of kinds of gases, there are merits that can reduce the number of nozzles and apparatus costs and can also facilitate maintenance. Meanwhile, in a film-forming temperature zone to be described later, the HCD gas and the $H_2$ gas do not react with each other, but the HCD gas and the $O_2$ gas may react with each other. Hence, it is preferable that the HCD gas and the $O_2$ gas are supplied into the process chamber 201 through the different nozzles.

At the manifold 209, a gas exhaust pipe 231 is installed to exhaust the inside atmosphere of the process chamber 201. A vacuum pump 246 used as a vacuum exhaust device is connected to the gas exhaust pipe 231 through a pressure sensor 245 used as a pressure detector and an Auto Pressure Controller (APC) valve 242 used as a pressure regulator (pressure regulation unit). Meanwhile, the APC valve 242 is an on-off valve configured to perform a vacuum exhaust and a vacuum exhaust stop of the process chamber 201 by opening and closing the valve and to perform a pressure regulation by adjusting a valve opening degree. While operating the vacuum pump 246, the opening degree of the APC valve 242 is adjusted, based on pressure detected by the pressure sensor 245, in order that the inside of the process chamber 201 is vacuum-exhausted to a predetermined pressure (vacuum degree). An exhaust system may be mainly configured by the gas exhaust pipe 231, the pressure sensor 245, the APC valve 242, and the vacuum pump 246.

At the lower side of the manifold 209, a seal cap 219 is installed as a furnace port lid that can air-tightly close the bottom end opening of the manifold 209. The seal cap 219 is configured so that it is brought into contact with the bottom end of the manifold 209 in a vertical direction from a lower part. The seal cap 219 is made of, for example, a metal such as stainless steel and is formed in a disk shape. On the top surface of the seal cap 219, an O-ring 220b is installed as a seal member contacting the bottom end of the manifold 209. At the side of the seal cap 219 opposite to the process chamber 201, a rotation mechanism 267 is installed to rotate a boat 217 used as a substrate holding tool described later. A rotation shaft 255 of the rotation mechanism 267 passes through the seal cap 219 and is connected the boat 217. The rotation mechanism 267 is configured to rotate the boat 217 so that the wafers 200 are rotated. The seal cap 219 is configured so that it is elevated in a vertical direction by a boat elevator 115 used as an elevation mechanism installed vertically at the outside of the process tube 203. The boat elevator 115 is configured to elevate the seal cap 219 so that the boat 217 is loaded into or unloaded from the process chamber 201.

The boat 217 used as a substrate holding tool is made of, for example, a heat-resistant material such as quartz or silicon carbide. The boat 217 is configured to hold a plurality of wafers 200 at a horizontal position in multiple stages, with their centers aligned. In addition, a heat insulation member 218 made of, for example, a heat-resistant material such as quartz or silicon carbide is installed at the lower part of the boat 217 and is configured to suppress heat transfer from the heater 207 toward the seal cap 52. Meanwhile, the heat insulation member 218 may be provided with a plurality of heat insulation plates made of a heat-resistant material such as quartz or silicon carbide, and a heat insulation plate holder configured to hold the heat insulation plates at a horizontal position in multiple stages. At the inside of the process tube 203, a temperature sensor 263 is installed as a temperature detector. An electrified state of the heater 207 is controlled, based on temperature information detected by the temperature sensor 263, in order that the inside temperature of the process chamber 201 is made to have a desired temperature distribution. The temperature sensor 263 is installed along the inner wall of the process tube 203 in the substantially same manner as the first nozzle 233a, the second nozzle 233b, and the third nozzle 233c.

A controller 280 used as a control device (control unit) is connected to the mass flow controllers 241a, 241b, 241c, 241d, 241e and 241f, the valves 243a, 243b, 243c, 243d, 243e and 243f, the pressure sensor 245, the APC valve 242, the heater 207, the temperature sensor 263, the vacuum pump 246, the rotation mechanism 267, the boat elevator 115, and so on. The controller 280 controls the gas flow rate regulations of the mass flow controllers 241a, 241b, 241c, 241d, 241e and 241f, the opening and closing operations of the valves 243a, 243b, 243c, 243d, 243e and 243f, the opening and closing of the APC valve 242 and the pressure regulation operations of the APC valve 242 based on the pressure sensor 245, the temperature regulation of the heater 207 based on the temperature sensor 263, the start and stop of the vacuum pump 246, the rotating speed regulation of the rotation mechanism 267, the elevating operation of the boat 217 by the boat elevator 115, and so on.

Next, explanation will be given on a method of forming an oxide film as an insulation film on a substrate, which is one of semiconductor device manufacturing processes, by using the process furnace of the substrate processing apparatus. Meanwhile, in the following description, the operations of the respective elements constituting the substrate processing apparatus are controlled by the controller 280.

Figure 3:
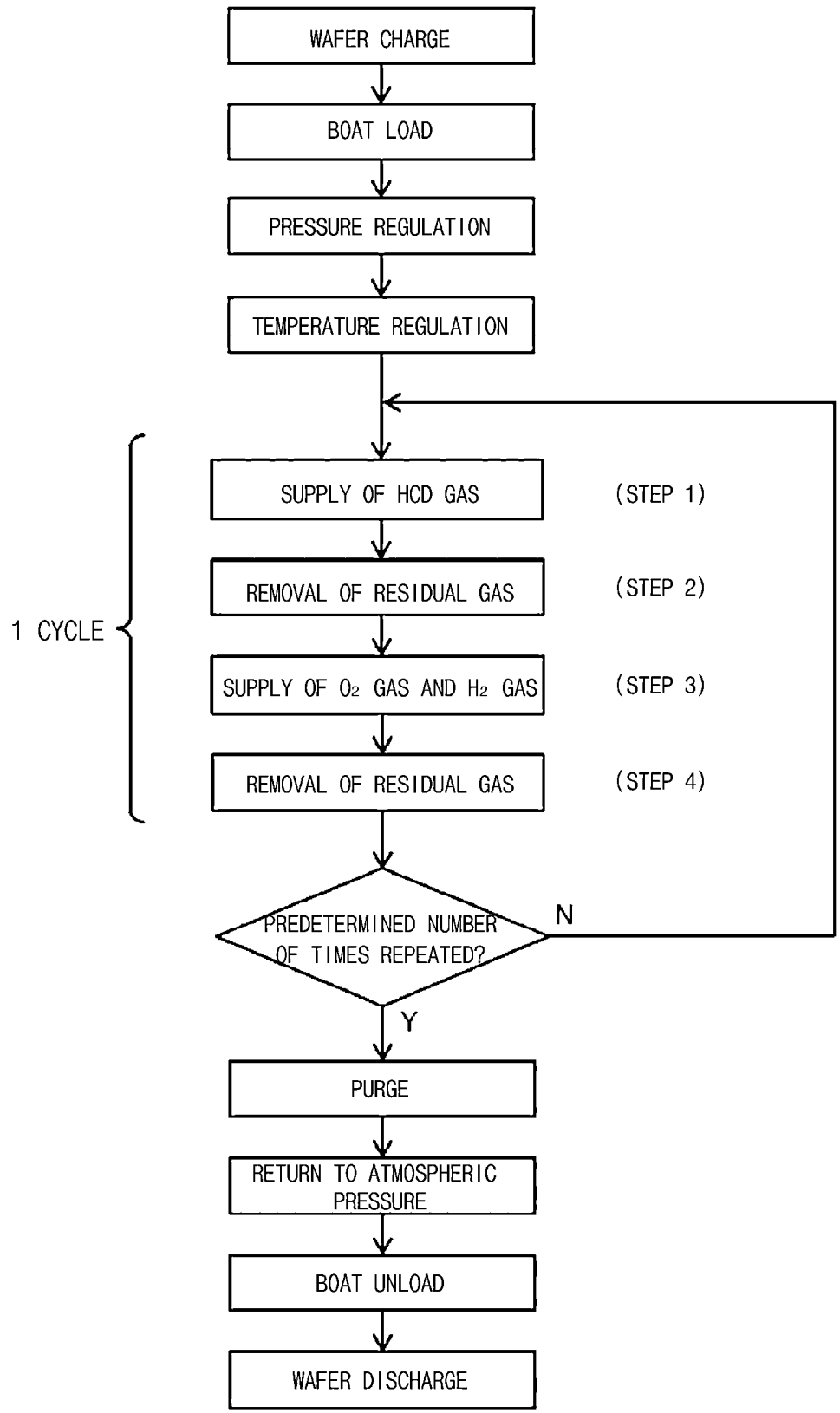
FIG. 3 illustrates a film-forming flow diagram of the current embodiment.
Figure 4A:
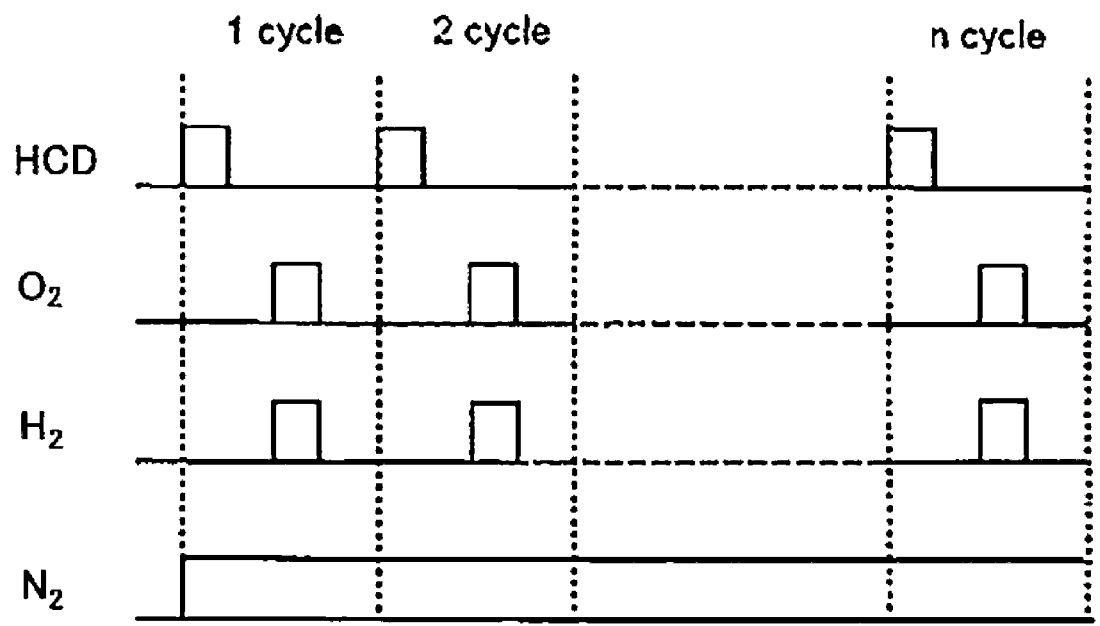
FIG. 4A and FIG. 4B illustrate timing diagrams of gas supply in a film-forming sequence of the current embodiment. Specifically.
Figure 4B:
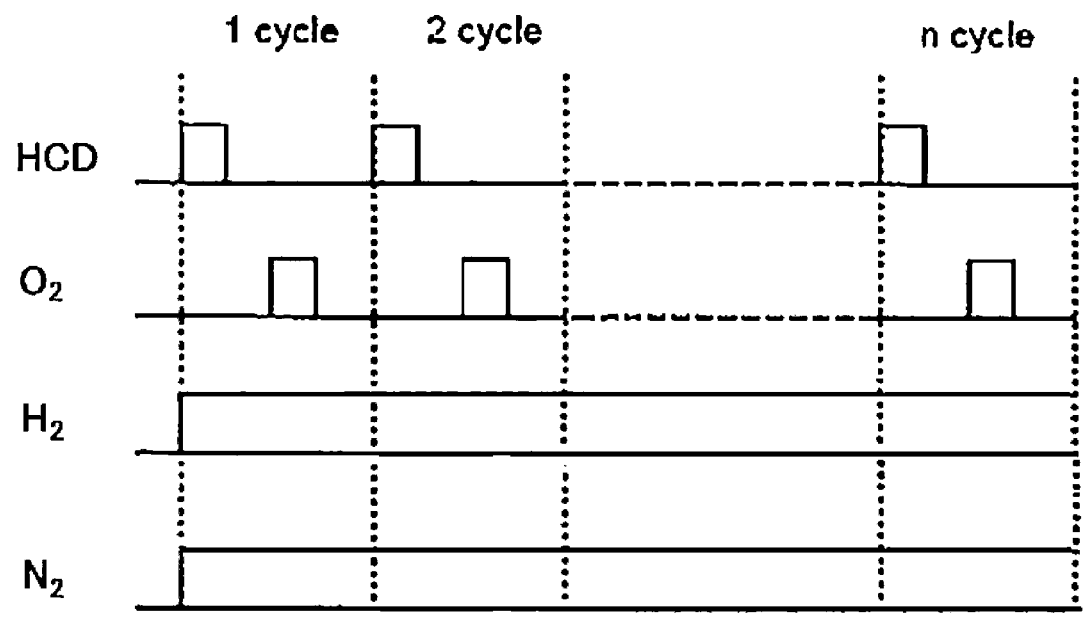

FIG. 3 illustrates a film-forming flow diagram of the current embodiment, and FIG. 4A and FIG. 4B illustrate timing diagrams of gas supply in a film-forming sequence of the current embodiment. In the film-forming sequence of the current embodiment, a process of forming a source adsorption layer or a silicon layer (hereinafter, referred to as a silicon-containing layer) on a substrate by supplying a source gas containing silicon as a predetermined element into the process vessel accommodating the substrate, and a process of changing the silicon-containing layer formed on the substrate to a silicon oxide layer by supplying an oxygen-containing gas and a hydrogen-containing gas into the process vessel that is set below the atmospheric pressure are defined as 1 cycle, and a silicon oxide film having a predetermined film thickness is formed on the substrate by performing the cycle at least one or more times. The source adsorption layer includes a discontinuous adsorption layer as well as a continuous adsorption layer of source molecules. The silicon layer includes a discontinuous layer as well as a continuous layer made of silicon, or a thin film formed by their overlapping. Meanwhile, the continuous layer made of silicon might be called a silicon thin film.

The process of forming the silicon-containing layer (source adsorption layer or silicon layer) on the substrate is performed under a condition where a CVD reaction occurs, and, at this time, the silicon-containing layer is formed in a range of less than 1 atomic layer to several atomic layers. Meanwhile, the layer of less than 1 atomic layer refers to an atomic layer that is formed discontinuously.

Also, in the process of changing the silicon-containing layer to the silicon oxide layer, an oxidizing species containing oxygen is generated by the reaction of the oxygen-containing gas and the hydrogen-containing gas at the inside of the process vessel that is set under a pressure atmosphere less than the atmospheric pressure, and the silicon-containing layer is oxidized by the oxidizing species and changed to the silicon oxide layer. Such an oxidation process may remarkably improve oxidizing power, compared with the case of supplying the oxygen-containing gas alone. That is, compared with the case of supplying the oxygen-containing gas alone, the remarkably improvement effect of the oxidizing power may be obtained by adding the hydrogen-containing gas to the oxygen-containing gas under a depressurized atmosphere. The process of changing the silicon-containing layer to the silicon oxide layer is performed under a depressurized atmosphere of non-plasma. Meanwhile, the hydrogen-containing gas may be supplied intermittently as illustrated in FIG. 4A, that is, only during the process of changing the silicon-containing layer to the silicon oxide layer, or the hydrogen-containing gas may be supplied continuously as illustrated in FIG. 4B, that is, always during the repetition of the process of forming the silicon-containing layer on the substrate and the process of changing the silicon-containing layer to the silicon oxide layer.

Details will be described hereinbelow. Meanwhile, in the current embodiment, HCD gas that is the source gas containing silicon is used as the source gas, $O_2$ gas is used as the oxygen-containing gas, and $H_2$ gas is used as the hydrogen-containing gas. Explanation will be given on an example of forming a silicon oxide film ($SiO_2$ film) as an insulation film on a substrate according to the sequence of FIG. 4A.

When a plurality of wafers 200 are charged into the boat 217 (wafer charge), as illustrated in FIG. 1, the boat 217 holding the plurality of wafers 200 is lifted by the boat elevator 115 and loaded into the process chamber 201 (boat load). In this state, the seal cap 219 seals the bottom end of the manifold 209 through the O-ring 220b.

The inside of the process chamber 201 is vacuum-exhausted to a desired pressure (vacuum degree) by the vacuum pump 246. In this case, the pressure inside the process chamber 201 is measured by the pressure sensor 245, and the APC valve 242 is feedback controlled, based upon the measured pressure (pressure regulation). In addition, the inside of the process chamber 201 is heated to a desired temperature by the heater 207. In this case, the electrified state of the heater 207 is feedback controlled, based upon temperature information detected by the temperature sensor 263, in order that the inside of the process chamber 201 is made to have a desired temperature distribution (temperature regulation). Subsequently, the boat 217 is rotated by the rotation mechanism 267, whereby the wafers 200 are rotated. Thereafter, the following four steps are carried out in sequence.

[Step 1]

The valve 243e of the third gas supply pipe 232c and the valve 243f of the third inert gas supply pipe 234c are opened, and HCD gas and inert gas (for example, $N_2$ gas) are supplied to the third gas supply pipe 232c and the third inert gas supply pipe 234c, respectively. The inert gas flows through the third inert gas supply pipe 234c, and its flow rate is controlled by the mass flow controller 241f. The HCD gas flows through the third gas supply pipe 232c, and its flow rate is controlled by the mass flow controller 241e. The flow-rate-controlled HCD gas is mixed with the flow-rate-controlled inert gas within the third gas supply pipe 232c, supplied into the heated and depressurized process chamber 201 through the gas supply holes 248c of the third nozzle 233c, and then exhausted through the gas exhaust pipe 231 (supply of HCD gas).

At this time, by appropriately regulating the APC valve 242, the pressure inside of the process chamber 201 is maintained below the atmospheric pressure, for example, at a pressure ranging of 10 Pa to 1,000 Pa. The supply flow rate of the HCD gas controlled by the mass flow controller 241e, for example, is in a range of 10 sccm to 1,000 sccm. Exposure time of the wafers 200 to the HCD gas, for example, is in a range of 1 second to 180 seconds. The temperature of the heater 207 is set so that the CVD reaction occurs within the process chamber 201. That is, the temperature of the heater 207 is set so that the temperature of the wafers 200 is in a range of 300° C. to 700° C., preferably 350° C. to 650° C. Meanwhile, if the temperature of the wafers 200 is below 300° C., the HCD is difficult to be adsorbed on the wafers 200. Furthermore, if the temperature of the wafers 200 is above 650° C., especially 700° C., the CVD reaction becomes strong and the uniformity is easily worsened. Therefore, it is preferable that the temperature of the wafers 200 is in a range of 300° C. to 700° C.

By supplying the HCD gas into the process chamber 201 under the above-described conditions, an HCD adsorption layer or a silicon layer (hereinafter, referred to as a silicon-containing layer) is formed in a range of less than 1 atomic layer to several atomic layers on the wafer 200 (base layer of the surface). Meanwhile, the HCD is surface-adsorbed on the wafer 200 to form the HCD adsorption layer. The HCD is self-decomposed and thus silicon molecules are deposited on the wafer 200 to form the silicon layer.

If the thickness of the silicon-containing layer formed on the wafer 200 exceeds several atomic layers, the oxidation action in the step 3 to be described later does not reach the entire silicon-containing layer. Furthermore, the minimum value of the silicon-containing layer that can be formed on the wafer 200 is less than 1 atomic layer. Therefore, it is preferable that the thickness of the silicon-containing layer is in a range of less than 1 atomic layer to several atomic layers.

In addition to HCD, an inorganic source such as tetrachlorosilane (TCS, $SiCl_4$), dichlorosilane (DCS, $SiH_2Cl_2$) or monosilane ($SiH_4$), and an organic source such as aminosilane-based tetrakisdimethylaminosilane (4DMAS, $Si(N(CH_3)_2))_4$), trisdimethylaminosilane (3DMAS, $Si(N(CH_3)_2))_3H$), bisdiethylaminosilane (2DEAS, $Si(N(C_2H_5)_2)_2H_2$) or bis(tertiary-butylamino)silane (BTBAS, $SiH_2(NH(C_4H_9))_2$) may be used as the Si-containing source.

In addition to $N_2$ gas, a rare gas such as Ar, He, Ne, or Xe may be used as the inert gas. Meanwhile, the use of the rare gas such as Ar or He, which is inert gas containing no nitrogen (N), may reduce N impurity concentration within the formed silicon oxide film. Therefore, it is preferable that the rare gas such as Ar or He is used as the inert gas. The same is applied to the steps 2, 3 and 4 described below.

[Step 2]

After forming the silicon-containing layer on the wafer 200, the supply of the HCD gas is stopped by closing the valve 243e of the third gas supply pipe 232c. At this time, the APC valve 242 of the gas exhaust pipe 231 is opened, and the inside of the process chamber 201 is vacuum-exhausted by the vacuum pump 246 to eliminate the residual HCD gas from the inside of the process chamber 201. At this time, if the inert gas is supplied into the process chamber 201, the elimination effect of the residual HCD gas is further increased (removal of residual gas). The temperature of the heater 207 at this time is set so that the temperature of the wafers 200 is in a range of 300° C. to 700° C., preferably 350° C. to 650° C., which is the same as the step of supplying the HCD gas.

[Step 3]

After removing the residual gas from the inside of the process chamber 201, the valve 243a of the first gas supply pipe 232a and the valve 243c of the first inert gas supply pipe 234a are opened, and $O_2$ gas and inert gas are supplied to the first gas supply pipe 232a and the first inert gas supply pipe 234a, respectively. The inert gas flows through the first inert gas supply pipe 234a and its flow rate is controlled by the mass flow controller 241c. The $O_2$ gas flows through the first gas supply pipe 232a and its flow rate is controlled by the mass flow controller 241a. The flow-rate-controlled $O_2$ gas is mixed with the flow-rate-controlled inert gas within the first gas supply pipe 232a, supplied into the heated and depressurized process chamber 201 through the gas supply holes 248a of the first nozzle 233a, and then exhausted through the gas exhaust pipe 231. At this time, the valve 243b of the second gas supply pipe 232b and the valve 243d of the second inert gas supply pipe 234b are opened, and $H_2$ gas and inert gas are supplied to the second gas supply pipe 232b and the second inert gas supply pipe 234b, respectively. The inert gas flows through the second inert gas supply pipe 234b and its flow rate is controlled by the mass flow controller 241d. The $H_2$ gas flows through the second gas supply pipe 232b and its flow rate is controlled by the mass flow controller 241b. The flow-rate-controlled $H_2$ gas is mixed with the flow-rate-controlled inert gas within the second gas supply pipe 232b, supplied into the heated and depressurized process chamber 201 through the gas supply holes 248b of the second nozzle 233b, and then exhausted through the gas exhaust pipe 231 (supply of $O_2$ gas and $H_2$ gas). Meanwhile, the $O_2$ gas and the $H_2$ gas are supplied into the process chamber 201, without being activated by plasma.

At this time, by appropriately regulating the APC valve 242, the pressure inside of the process chamber 201 is maintained below the atmospheric pressure, for example, at a pressure ranging from 1 Pa to 1,000 Pa. The supply flow rate of the $O_2$ gas controlled by the mass flow controller 241a, for example, is in a range of 1 sccm to 20 slm. The supply flow rate of the $H_2$ gas controlled by the mass flow controller 241b, for example, is in a range of 1 sccm to 20 slm. Meanwhile, exposure time of the wafers 200 to the $O_2$ gas and the $H_2$ gas, for example, is in a range of 1 second to 180 seconds. The temperature of the heater 207 is set so that the temperature of the wafers 200 is in a range of 350° C. to 1,000° C. Meanwhile, it was confirmed that when the temperature was within the above range, the improvement effect of the oxidizing power was obtained by the addition of the $H_2$ gas to the $O_2$ gas under the depressurized atmosphere. In addition, it was also confirmed that when the temperature of the wafers 200 was too low, the improvement effect of the oxidizing power was not obtained. However, if considering the throughput, it is preferable that the temperature of the heater 207 is set so that the wafers 200 have the same temperature as that in the step 1 of supplying the HCD gas, as a temperature where the improvement effect of the oxidizing power can be obtained, that is, the inside of the process chamber 201 is kept at the same temperature in the step 1 and the step 3. In this case, in the step 1 and the step 3, the temperature of the heater 207 is set so that the temperature of the wafers 200, that is, the temperature inside the process chamber 201, is in a range of 350° C. to 700° C., preferably 350° C. to 650° C. Furthermore, it is more preferable that the temperature of the heater 207 is set so that the inside of the process chamber 201 is kept at the same temperature through the step 1 to step 4 (described later).

In this case, the temperature of the heater 207 is set so that the temperature inside the process chamber 201 is constant within a range of 350° C. to 700° C., preferably 350° to 650° C. Meanwhile, to obtain the effect of the oxidizing power improvement by the addition of the $H_2$ gas to the $O_2$ gas under the depressurized atmosphere, the temperature inside the process chamber 201 needs to be 350° C. or more, and the temperature inside the process chamber 201 is preferably 400° C. or more, and more preferably 450° C. or more. When the temperature inside the process chamber 201 is 400° C. or more, it is possible to obtain the oxidizing power exceeding the oxidizing power obtained by $O_3$ oxidation process performed at a temperature of 400° C. or more. When the temperature inside the process chamber 201 is 450° C. or more, it is possible to obtain the oxidizing power exceeding the oxidizing power obtained by $O_2$ plasma oxidation process performed at a temperature of 450° C. or more.

By supplying the $O_2$ gas and the $H_2$ gas into the process chamber 201 under the above-described conditions, the $O_2$ gas and the $H_2$ gas are non-plasma activated under the heated and depressurized atmosphere and are reacted with each other to generate oxidizing species containing O such atomic oxygen. The oxidation process is performed primarily by the oxidizing species with respect to the silicon-containing layer formed on the wafer 200 in the step 1. Due to the oxidation process, the silicon-containing layer is changed to the silicon oxide layer ($SiO_2$ layer, also simply called a SiO layer).

In addition to the oxygen ($O_2$) gas, ozone ($O_3$) gas may be used as the oxygen-containing gas. Meanwhile, when the additional effect of the hydrogen-containing gas to nitric oxide (NO) gas or nitrous oxide ($N_2O$) gas in the above-described temperature zone was tested, it was confirmed that the effect of the oxidizing power improvement was not obtained, compared with the supply of NO gas alone or the supply of $N_2O$ gas alone. That is, it is preferable that the oxygen-containing gas containing no nitrogen (gas that does not contain nitrogen but contains oxygen) is used as the oxygen-containing gas. In addition to the hydrogen ($H_2$) gas, deuterium ($D_2$) gas may be used as the hydrogen-containing gas. Meanwhile, if ammonia ($NH_3$) gas or methane ($CH_4$) gas may be used, nitrogen (N) impurity or carbon (C) impurity may be incorporated into the film. That is, it is preferable that the hydrogen-containing gas containing no other element (gas that does not contain other element but contains only hydrogen) is used as the hydrogen-containing gas. That is, at least one gas selected from the group consisting of $O_2$ gas and $O_3$ gas may be used as the oxygen-containing gas, and at least one gas selected from the group consisting of $H_2$ gas and $D_2$ gas may be used as the hydrogen-containing gas.

[Step 4]

After changing the silicon-containing layer to the silicon oxide layer, the supply of the $O_2$ gas is stopped by closing the valve 243a of the first gas supply pipe 232a. Also, the supply of the $H_2$ gas is stopped by closing the valve 243b of the second gas supply pipe 232b. At this time, the APC valve 242 of the gas exhaust pipe 231 is opened, the inside of the process chamber 201 is vacuum-exhausted by the vacuum pump 246, and the residual $O_2$ gas or $H_2$ gas is eliminated from the inside of the process chamber 201. In this case, if inert gas is supplied into the process chamber 201, the elimination effect of the residual $O_2$ gas or $H_2$ gas is further increased (removal of residual gas). At this time, the temperature of the heater 207 is set so that the temperature of the wafers 200 is in a range of 350° C. to 700° C., preferably 350° C. to 650° C., which is the same as the step of supplying the $O_2$ gas and the $H_2$ gas.

The above-described steps 1 to 4 are defined as 1 cycle, and a silicon oxide film having a predetermined film thickness is formed on the substrate by performing the cycle at least one or more times.

After the silicon oxide film having the predetermined film thickness is formed, inert gas is supplied into and exhausted from the process chamber 201, so that the inside of the process chamber 201 is purged with the inert gas (purge). Thereafter, the atmosphere inside the process chamber 201 is replaced with the inert gas, and the pressure inside the process chamber 201 returns to the normal pressure (return to atmospheric pressure).

After that, the seal cap 219 is moved downward by the boat elevator 115, and the bottom end of the manifold 209 is opened. The boat 217 charged with the processed wafers 200 is unloaded from the bottom end of the manifold 209 to the outside of the process tube 203. Subsequently, the processed wafers 200 are discharged from the boat 217.

By performing the process of generating the oxidizing species containing O such as atomic oxygen through the reaction of the $O_2$ gas and the $H_2$ gas under the heated and depressurized atmosphere, and changing the silicon-containing layer to the silicon oxide layer by using the oxidizing species in the above-described step 3, energy of the oxidizing species breaks Si—N, Si—Cl, Si—H and Si—C bonds contained in the silicon-contained layer. Since energy for forming Si—O bond is higher than Si—N, Si—Cl, Si—H and Si—C bond energies, Si—N, Si—Cl, Si—H and Si—C bonds inside the silicon-contained layer are broken by applying energy necessary for Si—O bond formation to the silicon-containing layer to be oxidized. N, H, Cl, and C separated from the bond with Si are removed from the film and are exhausted in a form of $N_2$, $H_2$, $Cl_2$, HCl, or $CO_2$. In addition, since the bonds with N, H, Cl, and C are broken, the remaining bonds of Si is connected to O contained in the oxidizing species and changes to an $SiO_2$ layer. It was confirmed that the $SiO_2$ film formed by the film-forming sequence of the current embodiment was a high-quality film in which nitrogen, hydrogen, chlorine, and carbon concentrations were extremely low, and the Si/O ratio was very close to 0.5, which is a stoichiometric composition.

Meanwhile, as a result of comparing the oxidation process of the step 3 with the $O_2$ plasma oxidation process and the $O_3$ oxidation process, it was confirmed that the oxidizing power of the oxidation process of the step 3 was strongest under the low temperature atmosphere of 450° C. or more to 700° C. or less. To be exact, it was confirmed that the oxidizing power of the oxidation process of the step 3 exceeded the oxidizing power of the $O_3$ oxidation process at a temperature range of 400° C. or more to 700° C. or less, and the oxidizing power of the oxidation process of the step 3 exceeded the oxidizing powers of the $O_3$ oxidation process and the $O_2$ plasma oxidation process at a temperature range of 450° C. or more to 700° C. or less. Hence, it was ascertained that the oxidation process of the step 3 was very efficient under the low temperature atmosphere.

Meanwhile, the $O_2$ plasma oxidation process requires a plasma generator, and the $O_3$ oxidation process requires an ozonizer. However, since the oxidation process of the step 3 does not require them, there is a merit that can reduce apparatus costs. In the current embodiment, however, there is an alternative that may use $O_3$ or $O_2$ plasma as the oxygen-containing gas, and thus, the use of these gases is not denied. An oxidizing species having more higher energy may be generated by adding hydrogen-containing gas to the $O_3$ or $O_2$ plasma, and device characteristics may be improved by performing the oxidation process with the use of the oxidizing species.

In addition, it was confirmed that when the silicon oxide film was formed by the film-forming sequence of the current embodiment, the film-forming rate and the within-wafer film thickness uniformity were more excellent than the case of forming a silicon oxide film through a general CVD method. Meanwhile, the general CVD method refers to a method of simultaneously supplying DCS, which is an inorganic source, and $N_2O$ and forming a silicon oxide film (high temperature oxide (HTO) film) through a CVD method. In addition, it was confirmed that concentration of impurity such as nitrogen or chlorine within the silicon oxide film formed by the film-forming sequence of the current embodiment was extremely lower than the silicon oxide film formed by the general CVD method. Furthermore, it was confirmed that concentration of impurity within the silicon oxide film formed by the film-forming sequence of the current embodiment was extremely lower than the silicon oxide film formed by the CVD method using organic-based silicon source. Moreover, it was confirmed that the film-forming sequence of the current embodiment was excellent in the film-forming rate, the within-wafer film thickness uniformity, and the within-film impurity concentration, even though organic-based silicon source was used.

In the above-described embodiment, explanation has been given on the example of intermittently supplying the $H_2$ gas as the hydrogen-containing gas, as illustrated in FIG. 4A, that is, the example of supplying the $H_2$ gas only in the step 3. However, the $H_2$ gas may be continuously supplied, as illustrated in FIG. 4B, that is, the $H_2$ gas may be always continuously supplied during the repetition of the step 1 to the step 4. Also, in the case of intermittently supplying the $H_2$ gas, it may be supplied only in the step 1 and the step 3, or may be supplied during the step 1 to the step 3.

Moreover, the $H_2$ gas may be supplied over the step 2 to the step 3, or may be supplied during the step 3 to the step 4.

Cl may be extracted from the HCD gas by supplying $H_2$ gas during the first step 1, that is, the supply of the HCD gas, and the improvement of the film-forming rate and the reduction effect of Cl impurity may be obtained. Also, the film thickness uniformity may be effectively controlled by initiating the supply of $H_2$ gas in the step 2, that is, prior to the supply of $O_2$ gas after the stop of the supply of the HCD gas. Furthermore, an oxide film may be selectively formed on silicon, for example, with respect to a region where metal and silicon are exposed, by initiating the supply of $H_2$ gas in the step 2, that is, prior to the supply of $O_2$ gas. Moreover, the surface of the SiO layer formed in the step 3 is modified through hydrogen termination by supplying $H_2$ gas in the step 4, that is, prior to the initiation of the supply of the HCD gas after the stop of the supply of the $O_2$ gas, and the HCD gas supplied in the next step 1 may be easily adsorbed on the surface of the SiO layer.

First Embodiment

Next, a first embodiment will be described.

Silicon oxide films were formed by the sequence of the current embodiment and the sequence of the conventional art, and their film-forming rates and film-thickness distribution uniformities were measured. Meanwhile, the sequence of the conventional art is a sequence that uses gas containing oxygen active species (O*) obtained by plasma excitation of $O_2$ gas, instead of using $O_2$ gas and $H_2$ gas in the step 3 of the sequence of the current embodiment. Also, the film-forming condition in the sequence of the current embodiment (process condition in each step) was set within the condition range of the above-described embodiment. With regard to the film-forming condition in the sequence of the conventional art (process condition in each step), the process conditions in the steps 1, 2 and 4 was the same as the sequence of the current embodiment, and the process condition in the step 3 was as follows: pressure inside the process chamber was in a range of 10 Pa to 100 Pa, the supply flow rate of $O_2$ was in a range of 100 sccm to 10,000 sccm, the supply time of $O_2$ gas was in a range of 1 second to 180 seconds, the wafer temperature was in a range of 350° C. to 650° C., and high-frequency power was in a range of 50 W to 400 W.

Figure 5:
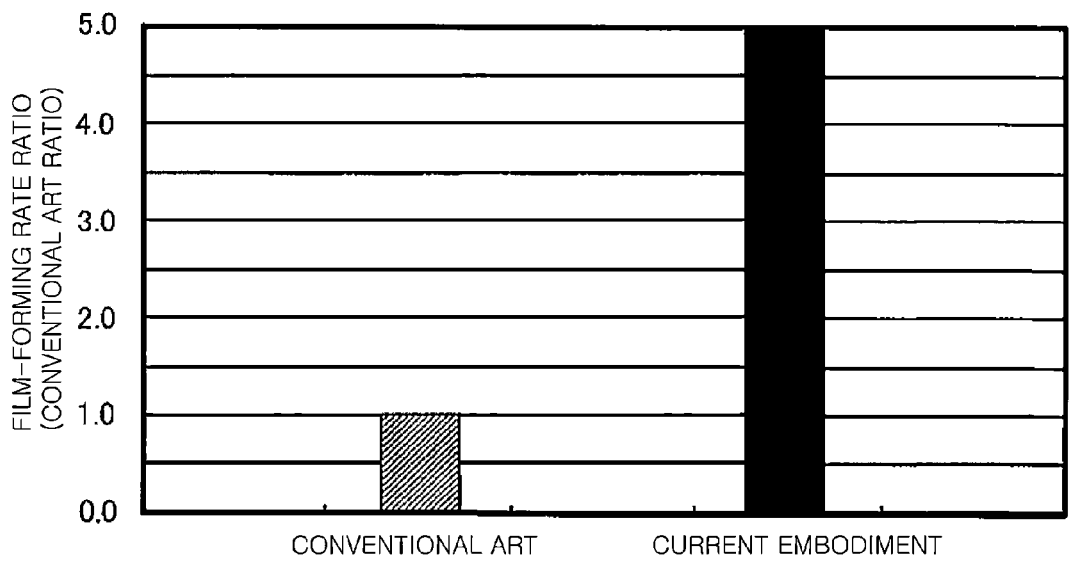
FIG. 5 illustrates a film-forming rate ratio of a silicon oxide film formed by the sequence of the conventional art and a silicon oxide film formed by the sequence of the current embodiment.
Figure 6:
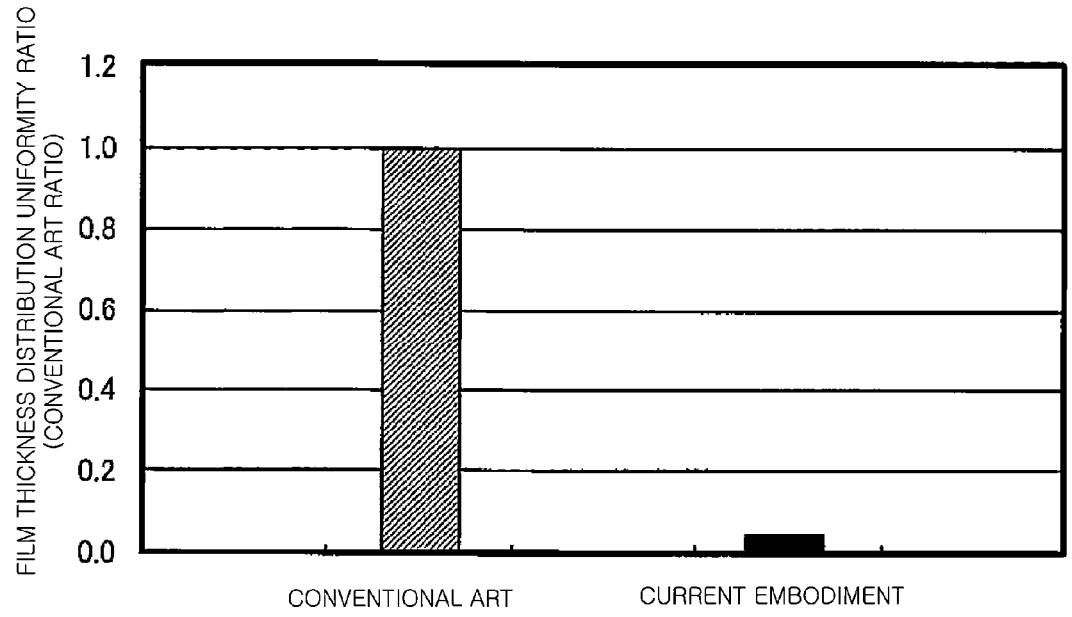
FIG. 6 illustrates a film thickness distribution uniformity ratio of a silicon oxide film formed by the sequence of the conventional art and a silicon oxide film formed by the sequence of the current embodiment.

The results are illustrated in FIG. 5 and FIG. 6. FIG. 5 illustrates the film-forming rate ratio of the silicon oxide film formed by the sequence of the current embodiment, on the assumption that the film-forming rate of the silicon oxide film formed by the sequence of the conventional art is 1. FIG. 6 illustrates the within-wafer film thickness distribution uniformity ratio of the silicon oxide film formed by the sequence of the current embodiment, on the assumption that the within-wafer film thickness distribution uniformity of the silicon oxide film formed by the sequence of the conventional art is 1. Meanwhile, the film thickness distribution uniformity represents the variation degree of the within-wafer film thickness distribution, and the within-wafer film thickness uniformity is considered to be excellent as its value is smaller.

As illustrated in FIG. 5, it can be seen that the film-forming rate of the silicon oxide film formed by the sequence of the current embodiment is remarkably high, compared with the silicon oxide film formed by the sequence of the conventional art. It can be seen that the film-forming rate of the sequence of the current embodiment is five times higher than the film-forming rate of the sequence of the conventional art. Meanwhile, the film-forming rate when the silicon oxide film was formed by the sequence of the current embodiment was about 2 Å/cycle.

In addition, as illustrated in FIG. 6, it can be seen that the film thickness distribution uniformity of the silicon oxide film formed by the sequence of the current embodiment is remarkably improved, compared with the silicon oxide film formed by the sequence of the conventional art. It can be seen that the sequence of the current embodiment obtains very excellent film thickness distribution uniformity corresponding to about 1/20 of the film thickness distribution uniformity of the silicon oxide film formed by the sequence of the conventional art. Meanwhile, the film thickness distribution uniformity of the silicon oxide film formed by the sequence of the current embodiment was about 1.5%.

Explanation will be given on the merit of the sequence of the current embodiment that oxidizes the silicon-containing layer (HCD adsorption layer or silicon layer), which is formed on the substrate, by the oxidizing species containing O obtained by reaction of $O_2$ gas and $H_2$ gas under the heated and depressurized atmosphere, instead of O* obtained by plasma excitation of $O_2$ like the sequence of the conventional art.

Figure 7A:
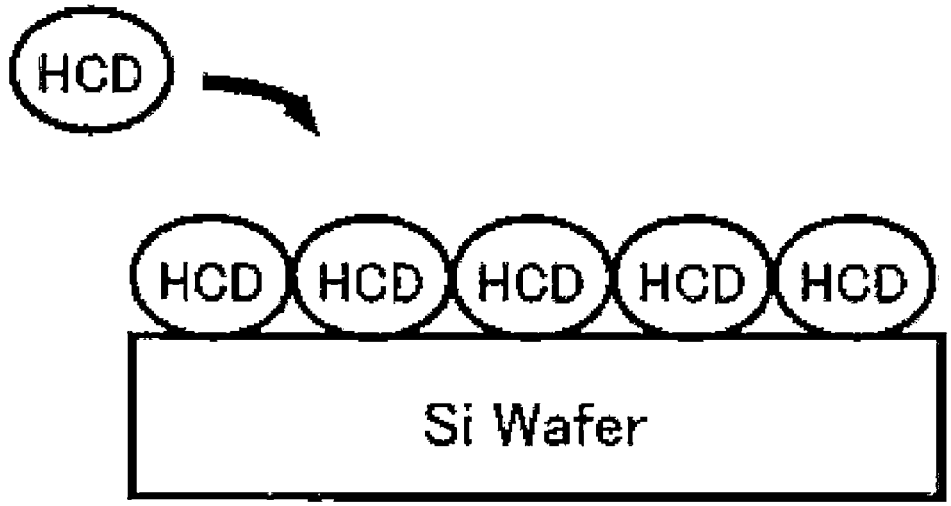
FIGS. 7A to 7C illustrate $SiO_2$ deposition models in the sequence of the conventional art.
Figure 7B:
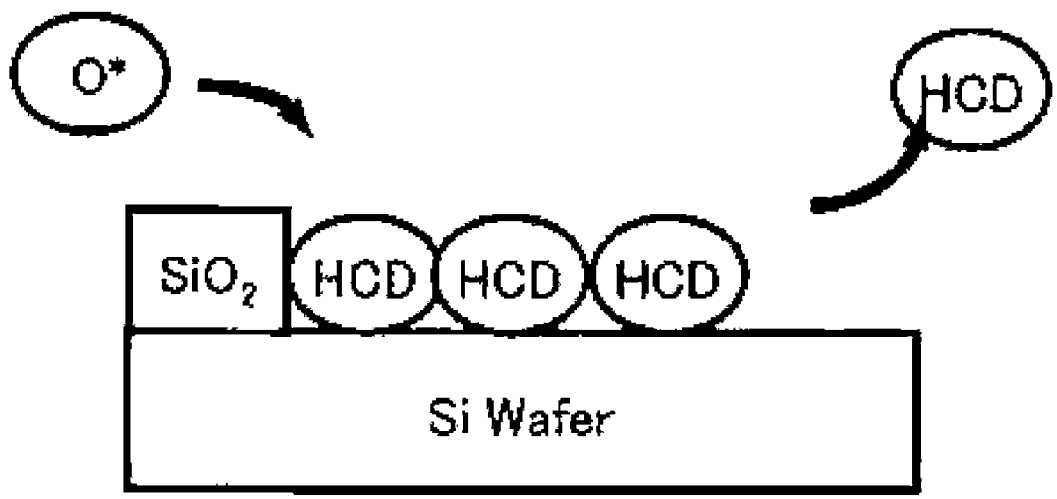
Figure 7C:
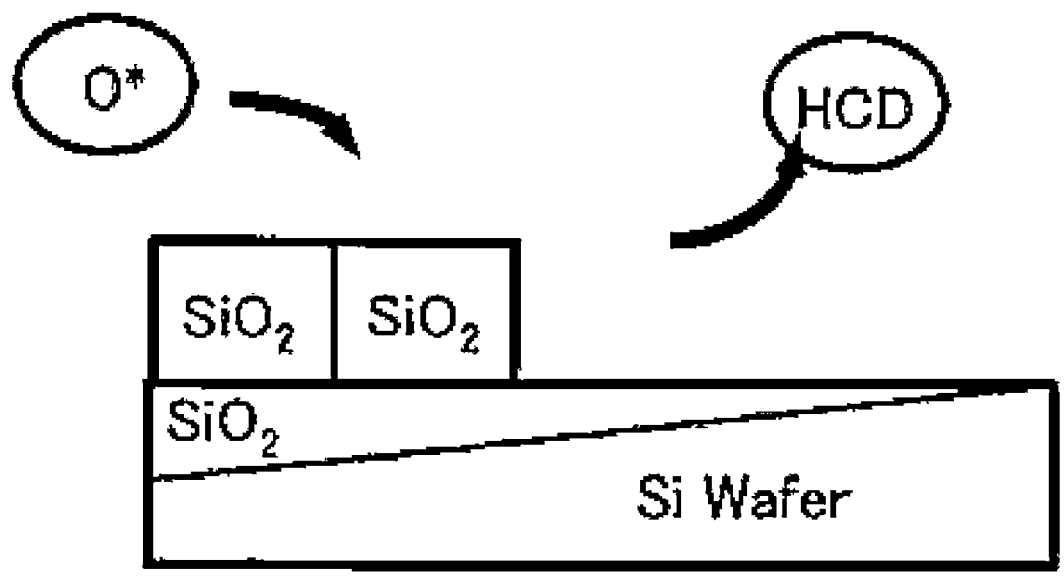
Figure 8A:
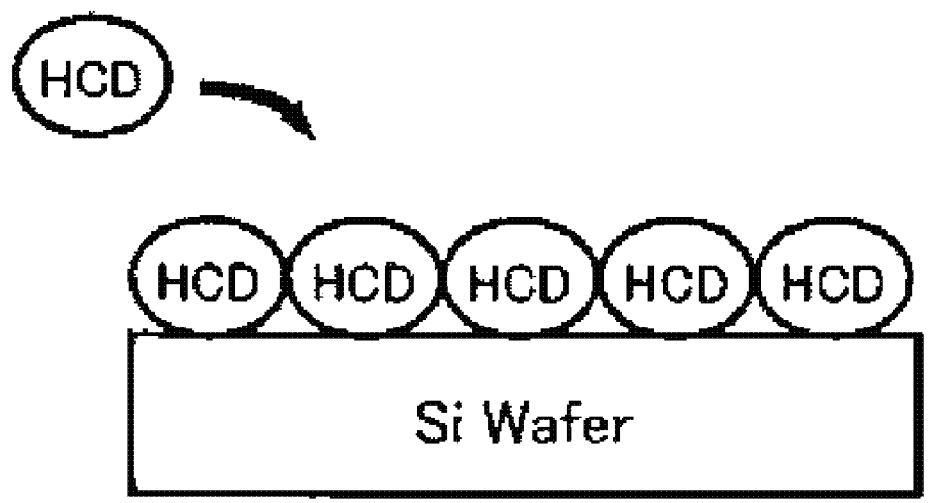
FIGS. 8A to 8C illustrate $SiO_2$ deposition models in the sequence of the current embodiment.
Figure 8B:
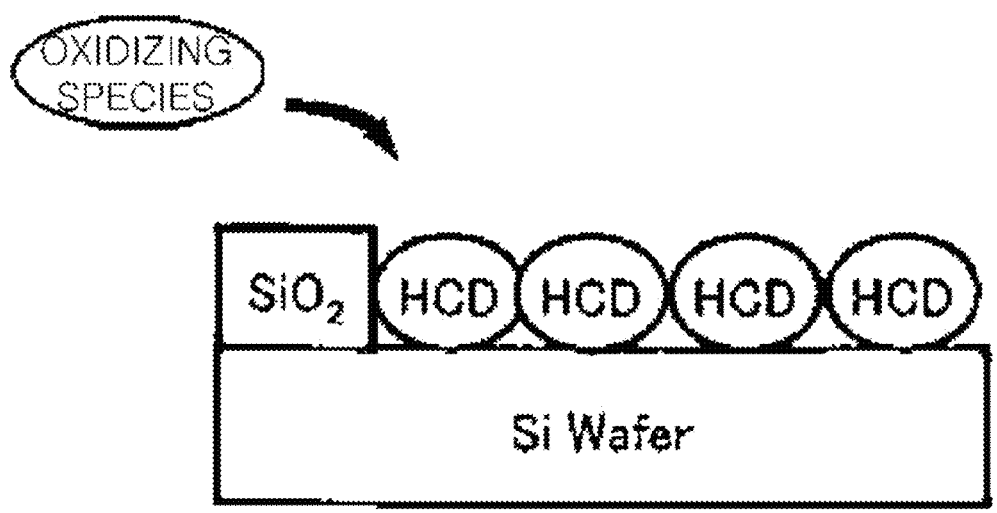
Figure 8C:
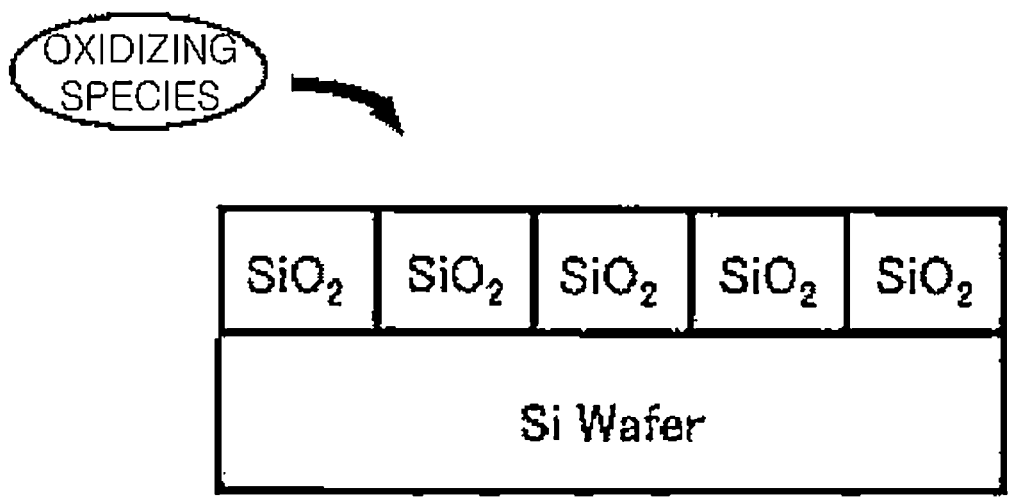

FIGS. 7A to 7C illustrate $SiO_2$ deposition models in the sequence of the conventional art, and FIGS. 8A to 8C illustrate $SiO_2$ deposition models in the sequence of the current embodiment. Meanwhile, the sequences show the case of forming the adsorption layer of HCD as the source on the surface of the silicon wafer in the step 1.

In the case of the sequence of the conventional art of FIGS. 7A to 7C, if HCD gas is supplied as a source gas, as illustrated in FIG. 7A, HCD is adsorbed on the surface of the silicon wafer, whereby an HCD adsorption layer is formed on the silicon wafer.

In such a state, if gas containing oxygen active species (O*) obtained by plasma excitation of $O_2$ gas is supplied, as illustrated in FIG. 7B, the oxidation of the HCD molecules adsorbed on the surface of the silicon wafer is performed from the upstream toward the downstream of the $O_2$ gas (O*) flow in the wafer surface. On the other hand, the HCD molecules of the downstream of the $O_2$ gas flow in the wafer surface are desorbed from the surface of the silicon wafer.

It is though that this is because O* obtained by the plasma excitation of the $O_2$ gas has energy enough to oxidize the HCD molecules and break the Si—O bond or the Si—Si bond. That is, in this case, fixation of Si on the surface of the silicon wafer is not sufficiently achieved, and Si is not fixed on the surface of the silicon wafer in some regions. Also, as illustrated in FIG. 7C, O* also oxidizes the surface of the silicon wafer, which is the base of the formed $SiO_2$ film.

For this reason, if the $SiO_2$ film is formed by the sequence of the conventional art, while rotating the silicon wafer, the film thickness of the outer periphery of the $SiO_2$ film becomes thick, and the film thickness distribution uniformity in the wafer surface is worsened (see FIG. 6). Furthermore, the HCD molecules desorbed from the surface of the silicon wafer flow to the downstream inside the process chamber, and they are re-adsorbed on the wafers disposed at the downstream of the $O_2$ gas flow inside the process chamber, that is, the lower part of the wafer arrangement area, and then are oxidized. Thus, the wafer-to-wafer film thickness distribution uniformity may also be worsened.

On the contrary, in the case of the sequence of the current embodiment of FIG. 8, if the HCD gas is supplied, as illustrated in FIG. 8A, HCD is adsorbed on the surface of the silicon wafer, whereby an HCD adsorption layer is formed on the silicon wafer.

In such a state, if gas containing oxidizing species containing O obtained by reaction of $O_2$ gas and $H_2$ gas under the heated and depressurized atmosphere is supplied, as illustrated in FIG. 8B, the oxidation of the HCD molecules adsorbed on the surface of the silicon wafer is performed from the upstream toward the downstream of the $O_2$ gas and $H_2$ gas (oxidizing species) flow within the wafer surface. At this time, the HCD molecules of the downstream of the $O_2$ gas and $H_2$ gas flow within the wafer surface are not desorbed from the surface of the silicon wafer. That is, desorption of the HCD molecules from the surface of the silicon wafer, which has occurred in the sequence of the conventional art, is suppressed. In the case of using $O_3$ or O* obtained by the plasma excitation of $O_2$ gas, extra energy applied to the silicon wafer breaks Si—O bond or Si—Si bond. On the other hand, in the case of using oxidizing species obtained by the reaction of $O_2$ gas and $H_2$ gas under the heated and depressurized atmosphere, new energy is not applied to the silicon wafer, but HCD molecules are oxidized by oxidizing species generated by the reaction of $O_2$ gas and $H_2$ gas in the vicinity of the silicon wafer. That is, in the case of the oxidation process of the current embodiment, oxidation is performed with the oxidizing power higher than that of the $O_2$ plasma oxidation process or $O_3$ oxidation process, and extra energy enough to break Si—O bond or Si—Si bond is not generated. In this case, since fixation of Si on the surface of the silicon wafer is sufficiently carried out, Si is fixed uniformly on the surface of the silicon wafer. Therefore, as illustrated in FIG. 8C, HCD molecules adsorbed on the surface of the silicon wafer are oxidized uniformly over the entire wafer surface and changed to an $SiO_2$ layer, and the $SiO_2$ layer is formed uniformly on the surface of the silicon wafer over the entire wafer surface. By repeating the above processes, the intra-wafer film thickness uniformity of the $SiO_2$ film formed on the wafer becomes excellent (see FIG. 6). Meanwhile, in the case of adding $H_2$ to $O_2$ plasma, oxidation by oxidizing species generated by reaction of $O_2$ and $H_2$ is dominant. Also, in the case of adding $H_2$ to $O_3$, oxidation by oxidizing species generated by reaction of $O_3$ and $H_2$ is dominant. That is, in the case of using $O_2$ plasma or $O_3$, the same effect as the oxidation process of the current embodiment can be obtained by adding $H_2$.

Meanwhile, in the sequence of the conventional art of FIG. 7 and the sequence of the current embodiment of FIG. 8, the case of forming the HCD adsorption layer on the surface of the silicon wafer in the step 1 has been described. The case where the HCD gas supplied in the first step is self-decomposed and the silicon layer is formed on the surface of the silicon wafer may be considered as the same. In this case, if the HCD molecules of FIG. 7 and FIG. 8 are replaced with the Si molecules, the same explanation can be given.

Second Embodiment

Next, a second embodiment will be described.

Silicon oxide films were formed by the sequence of the current embodiment and the general CVD method, and their within-film impurity concentration were measured. Meanwhile, the general CVD method is a method that forms a silicon oxide film (HTO film) by a CVD method by supplying DCS and $N_2O$ at the same time, and the film-forming temperature was 780° C. Also, in each step of the sequence of the current embodiment, the film-forming temperature was constant at 600° C., and the other film-forming conditions (process condition of each step) were set within the condition ranges of the above-described embodiment. Also, the measurement of impurities inside the film was carried out by using SIMS.

Figure 9B:
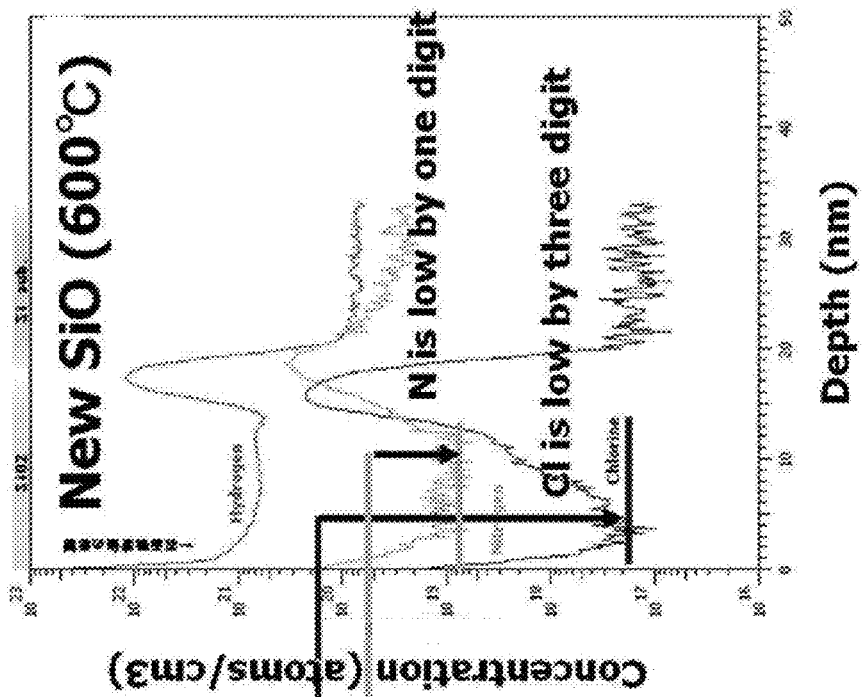
FIG. 9B is a graph illustrating concentration of impurities (H, C, N, Cl) contained within a silicon oxide film formed by the sequence of the current embodiment.
Figure 9A:
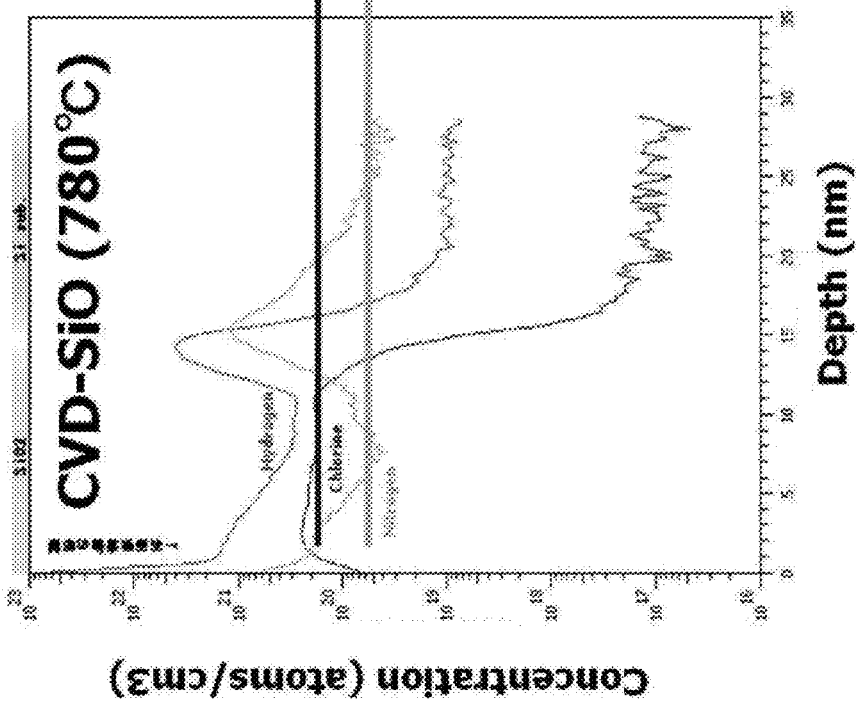
FIG. 9A is a graph illustrating concentration of impurities (H, C, N, Cl) contained within a silicon oxide film formed by a general CVD method.

The results are illustrated in FIGS. 9A and 9B. FIG. 9A illustrates concentration of impurities (H, C, N, Cl) contained within the silicon oxide film formed by the general CVD method. FIG. 9B illustrates concentration of impurities (H, C, N, Cl) contained within the silicon oxide film formed by the sequence of the current embodiment. In the drawings, the horizontal axis represents the depth (nm) from the surface of the $SiO_2$ film, and the vertical axis represents concentration (atoms/$cm^3$) of H, C, N, and Cl.

As illustrated in FIGS. 9A and 9B, concentration of H among impurities contained within the silicon oxide film formed by the sequence of the current embodiment is identical to concentration of H contained within the silicon oxide film formed by the general CVD method. However, it can be seen that concentration of Cl among impurities contained within the silicon oxide film formed by the sequence of the current embodiment is lower by three digits than concentration of Cl contained within the silicon oxide film formed by the general CVD method. Also, it can be seen that concentration of N among impurities contained within the silicon oxide film formed by the sequence of the current embodiment is lower by one digit than concentration of N contained within the silicon oxide film formed by the general CVD method. Meanwhile, concentration of C among the impurities contained within the silicon oxide film formed by the sequence of the current embodiment and concentration of C contained within the silicon oxide film formed by the general CVD method are all below the lower detection limit. That is, it can be seen that, when compared with the silicon oxide film formed by the general CVD method, the silicon oxide film formed by the sequence of the current embodiment has lower concentration of Cl and N among the impurities, and, among them, concentration of Cl is extremely low. Meanwhile, due to the limitation of the test device used in the second embodiment, N impurity was incorporated in ppm order within the silicon oxide film formed by the sequence of the current embodiment. It was confirmed that N concentration became a background level (no detection) because the purge gas was changed from $N_2$ gas to the rare gas such as Ar gas.

Third Embodiment

Next, a third embodiment will be described.

A silicon oxide film was formed on a wafer, where a film containing silicon atoms and a film containing metal atoms on the surface thereof are exposed, by the sequence of the current embodiment, and SEM observation of its sectional structure was carried out. Regarding a wafer (Si sub) used herein, a silicon oxide film was formed as a gate oxide film (Gate Ox) on the surface of the wafer, and a polycrystalline silicon film (Poly-Si) and a tungsten film (W) were formed as a gate electrode on the gate oxide film. Also, a silicon nitride film (SiN) was formed on the gate electrode. Meanwhile, the film containing silicon atoms is a silicon oxide film, a polycrystalline silicon film, or a silicon nitride film, and the film containing metal atoms is a tungsten film. On the wafer, that is, the silicon oxide film, the polycrystalline silicon film, the tungsten film and the silicon nitride film, the silicon oxide film was formed as a sidewall spacer by the sequence of the current embodiment. In the sequence of the current embodiment, the film-forming condition (process condition in each step) was set within the condition range of the above-described embodiment. Meanwhile, $O_2$ gas and $H_2$ gas were supplied into the process chamber under hydrogen-rich condition, that is, under the condition that the supply flow rate of $H_2$ gas was higher than the supply flow rate of $O_2$ gas.

Figure 10B:
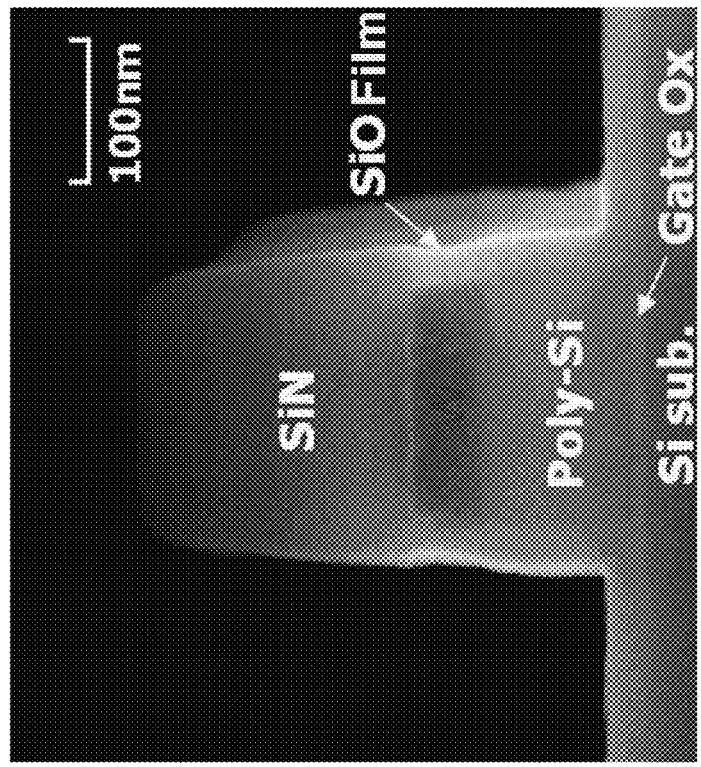
FIG. 10B is a SEM image illustrating the state of the wafer after the silicon oxide film was formed by the sequence of the current embodiment.
Figure 10A:
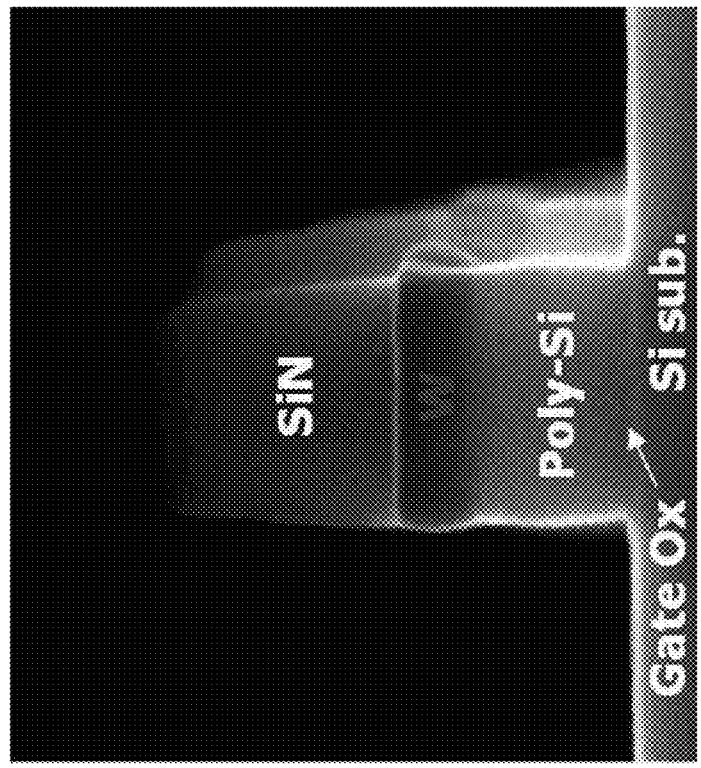
FIG. 10A is a SEM image illustrating the state of the wafer before the silicon oxide film was formed by the silicon oxide film by the sequence of the current embodiment.

The SEM images are shown in FIG. 10A and FIG. 10B. FIG. 10A illustrates the state of the wafer before the silicon oxide film was formed by the sequence of the current embodiment, and FIG. 10B illustrates the state of the wafer after the silicon oxide film was formed by the sequence of the current embodiment. It can be seen from FIG. 10A and FIG. 10B that if the silicon oxide film is formed under the above-described process condition by the sequence of the current embodiment, the silicon oxide film can be uniformly deposited on the silicon oxide film, the polycrystalline film, the tungsten film and the silicon nitride film, without oxidizing the sidewall of the tungsten film.

Fourth Embodiment

Next, a fourth embodiment will be described.

Silicon oxide films were formed by the sequence of the current embodiment and the general CVD method, and their within-wafer film thickness uniformities (WIW Unif) were measured. Meanwhile, the general CVD method is a method that forms a silicon oxide film (HTO film) by a CVD method by supplying DCS and $N_2O$ at the same time, and the film-forming temperature was 800° C. Also, in the sequence of the current embodiment, the film-forming temperature was changed in a range from 450° C. to 800° C. The other film-forming conditions (process condition of each step) were set within the condition ranges of the above-described embodiment.

Figure 11:
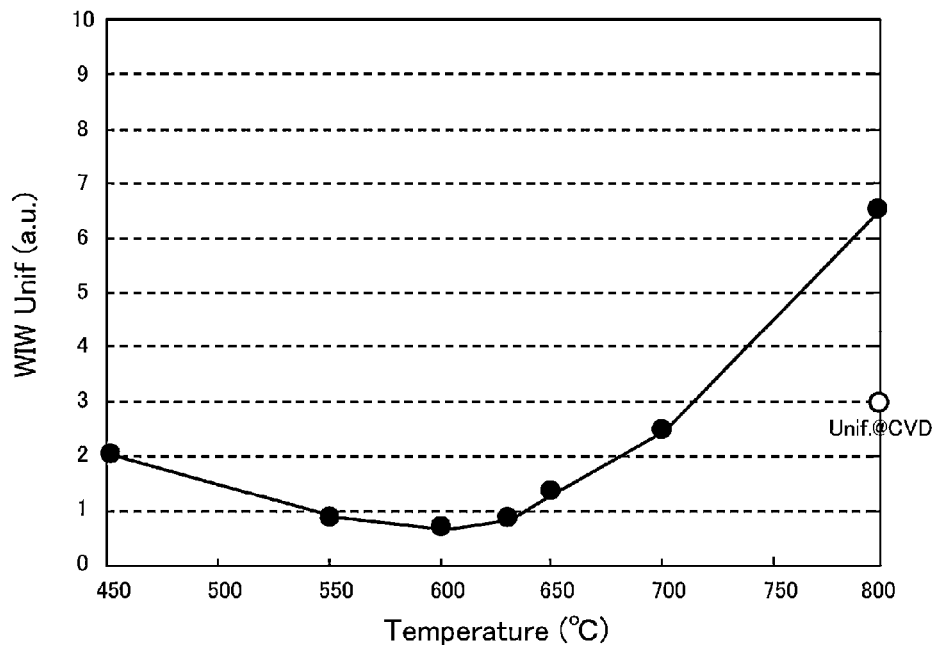
FIG. 11 is a graph showing the relationship between the within-wafer film thickness uniformity and the temperature of the wafer.

The results are illustrated in FIG. 11. FIG. 11 is a graph showing the relationship between the within-wafer film thickness uniformity and the film-forming temperature (temperature of the wafer). In FIG. 11, the horizontal axis represents the film-forming temperature (° C.), and the vertical axis represents the within-wafer film thickness uniformity (arbitrary unit). In FIG. 11, the black circle (•) represents the within-wafer film thickness uniformity of the silicon oxide film formed by the sequence of the current embodiment. Also, the white circle (○) represents the within-wafer film thickness uniformity of the silicon oxide film formed by the general CVD method. Meanwhile, the within-wafer film thickness uniformity represents the variation degree of the within-wafer film thickness distribution, and the within-wafer film thickness uniformity is considered to be excellent as its value is smaller.

It can be seen from FIG. 11 that, when the film-forming temperature is above 700° C., the within-wafer film thickness uniformity of the silicon oxide film formed by the sequence of the current embodiment is worse than the within-wafer film thickness uniformity of the silicon oxide film formed by the general CVD method, and, when the film-forming temperature is 700° C. or less, the within-wafer film thickness uniformity of the silicon oxide film formed by the sequence of the current embodiment is more excellent than the within-wafer film thickness uniformity of the silicon oxide film formed by the general CVD method. Also, when the film-forming temperature is 650° C. or less, the within-wafer film thickness uniformity of the silicon oxide film formed by the sequence of the current embodiment is about ½ of the within-wafer film thickness uniformity of the silicon oxide film formed by the general CVD method, and, when the film-forming temperature is 630° C. or less, the within-wafer film thickness uniformity of the silicon oxide film formed by the sequence of the current embodiment is about ⅓ of within-wafer film thickness uniformity of the silicon oxide film formed by the general CVD method. Hence, it can be seen that the within-wafer film thickness uniformity is extremely excellent. In particular, it can be seen that, when the film-forming temperature is 650° C. or less, especially 630° C. or less, the within-wafer film thickness uniformity becomes remarkably excellent, and furthermore, it becomes stable.

In all these aspects, the film-forming temperature (temperature of the wafer) in the sequence of the current embodiment is preferably 700° C. or less from the viewpoint of the within-wafer film thickness uniformity of the formed silicon oxide film, and more preferably 650° C. or less, specifically 630° C. or less, in order to ensure the better uniformity.

Fifth Embodiment

Next, a fifth embodiment will be described.

Comparison of oxidizing powers was carried out with respect to the oxidation process of the step 3 of the sequence of the current embodiment (hereinafter, referred to as $O_2+H_2$-added oxidation process), the case where the oxidation process of the step 3 of the sequence of the current embodiment was performed in combination with plasma (hereinafter, referred to as $O_2+H_2$-added plasma oxidation process), the $O_2$ plasma oxidation process, the $O_3$ oxidation process, and the $O_2$ oxidation process. Meanwhile, the $O_2+H_2$-added plasma oxidation process refers to a case that performs an oxidation process by activating $H_2+O_2$ with plasma. The oxidizing power was determined by an oxidized silicon amount, that is, a film thickness of a silicon oxide film formed by an oxidization process to silicon. The oxidation process temperature (temperature of the wafer) was changed in a range from 30° C. to 600° C. The other oxidation process conditions were set within the oxidation process condition ranges of the step 3 of the above-described embodiment.

Figure 12:
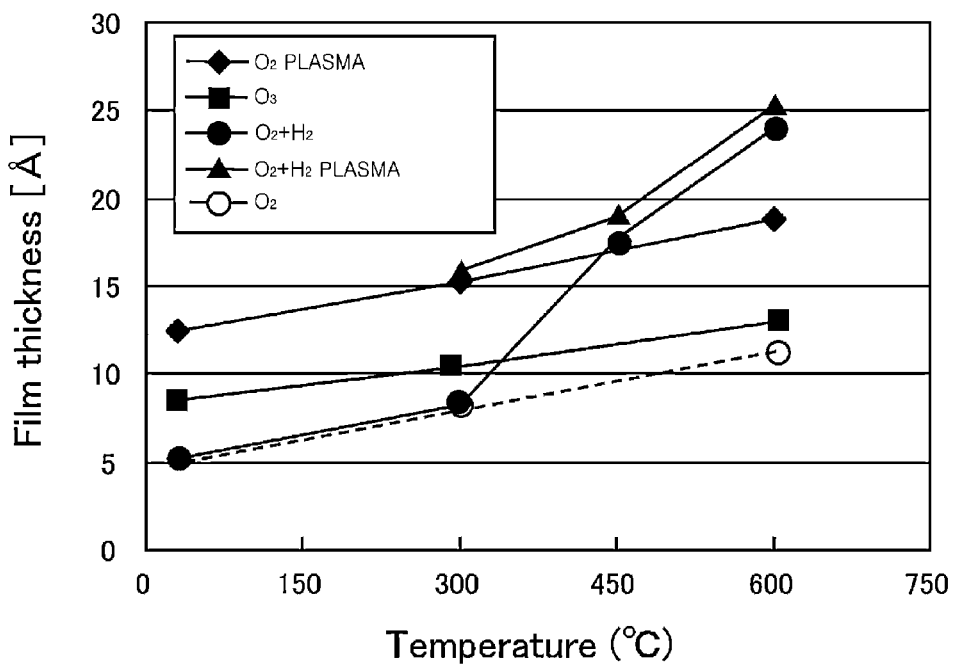
FIG. 12 is a graph showing the relationship between the film thickness of the silicon oxide film and the temperature of the wafer.

The results are illustrated in FIG. 12. FIG. 12 is a graph showing the relationship between the film thickness of the silicon oxide film and the oxidation process temperature (temperature of the wafer). In FIG. 12, the horizontal axis represents the oxidation process temperature (° C.), and the vertical axis represents the film thickness (Å) of the silicon oxide film. In FIG. 12, the black circle (•) represents the oxidized amount by the $O_2+H_2$-added oxidation process, and the black triangle (▲) represents the oxidized amount by the $O_2+H_2$-added plasma oxidation process. Also, the black rhombus (♦), the black square (■), and the white circle (○) represent the oxidized amounts by the $O_2$ plasma oxidation process, the $O_3$ oxidation process, and the $O_2$ oxidation process, respectively.

It can be seen from FIG. 12 that, at the temperature of 300° C. or less, the oxidized amount by the $O_2+H_2$-added oxidation process is smaller than the oxidized amount by the $O_2$ plasma oxidation process or the $O_3$ oxidation process, and is equal to the oxidized amount by the $O_2$ oxidation process performed with $O_2$ alone. However, at the temperature of above 300° C., especially 350° C. or more, the oxidized amount by the $O_2+H_2$-added oxidation process is larger than the oxidized amount by the $O_2$ oxidation process with $O_2$ alone. Also, at the temperature of 400° C. or more, the oxidized amount by the $O_2+H_2$-added oxidation process is larger than the oxidized amount by the $O_3$ oxidation process. Furthermore, it can be seen that, at the temperature of 450° C. or more, the oxidized amount by the $O_2+H_2$-added oxidation process is larger than the oxidized amount by the $O_3$ oxidation process and the oxidized amount by the $O_2$ plasma oxidation process.

In these aspects, the film-forming temperature (temperature of the wafer) in the sequence of the current embodiment is preferably 300° C. or more, specifically 350° C. or more, in view of the oxidizing power in the $O_2+H_2$-added oxidation process, and more preferably 400° C. or more, specifically 450° C. or more, in order to further improve the oxidizing power. Meanwhile, in the oxidation process, if the film-forming temperature is 450° C. or more, it is possible to obtain the oxidizing power higher than the oxidizing power by the $O_3$ oxidation process and the oxidizing power by the $O_2$ plasma oxidation process. In addition, it was confirmed in the oxidation process that, at the temperature of 650° C. or 700° C., it is possible to obtain the oxidizing power higher than the oxidizing power by the $O_3$ oxidation process and the oxidizing power by the $O_2$ plasma oxidation process.

It is considered that the oxidizing power becomes strong at the temperature of above 300° C. because of water ($H_2O$) formed by the reaction of $O_2$ and $H_2$, or oxygen having high energy generated at that time, and diffusion acceleration of oxygen ion ($O^{2-}$) due to diffusion of hydrogen ion ($H^+$) having high diffusion speed into the silicon oxide film. Meanwhile, the bond energy of the water (H—O—H) is higher than the bond energy of the oxygen molecule (O—O) or the bond energy of the hydrogen molecule (H—H). It may be said that the state of the wafer formed by the bond of oxygen atom and hydrogen atom is more stable than the state of the oxygen molecule formed by the bond of oxygen atoms. Also, according to the pressure characteristic inside the furnace, it is apparent that the water is generated by the reaction of $O_2$ and $H_2$. For these viewpoints, it is considered that the oxidizing power is improved by the addition of $H_2$ to $O_2$.

Meanwhile, at the temperature of 300° C. or more, the oxidized amount by the $O_2+H_2$-added plasma oxidation process is larger than the oxidized amount by the $O_2+H_2$-added oxidation process, the oxidized amount by the $O_3$ oxidation process, and the oxidized amount by the $O_2$ plasma oxidation process. Hence, among them, the oxidized amount by the $O_2+H_2$-added plasma oxidation process is largest. Therefore, it may be said that the oxidation process of the step 3 in the sequence of the current embodiment is also effective when it is performed in combination with plasma. Also, it was confirmed that, at the temperature of 650° C. or 700° C., the oxidizing power by the $O_2+H_2$-added plasma oxidation process is higher than the oxidizing power by the $O_2+H_2$-added oxidation process, and the oxidizing power by the $O_3$ oxidation process, and the oxidizing power by the $O_2$ plasma oxidation process. Meanwhile, the oxidation process may be performed by activating the addition of $H_2$ to $O_2$ with plasma, or the oxidation process may be performed by adding $H_2$ to $O_2$ plasma, or the oxidation process may be performed by adding $H_2$ plasma to $O_2$.

That is, the oxidation process may be performed by activating either or both of $O_2$ and $H_2$ with plasma. In this case, the same effect as the $O_2+H_2$-added plasma oxidation process can be obtained.

Sixth Embodiment

Next, a sixth embodiment will be described.

Comparison of oxidizing powers was carried out with respect to the case where the oxidation process in the step 3 of the sequence of the current embodiment was performed with $N_2O$ (hereinafter, referred to as $N_2O$ oxidation process), the case where the oxidation process was performed by adding $H_2$ to $N_2O$ (hereinafter, referred to as $N_2O+H_2$ oxidation process), and the case where the oxidation process was performed by adding $H_2$ to NO (hereinafter, referred to as $NO+H_2$ oxidation process). The comparison of the oxidizing powers was carried out in the same manner as the fifth embodiment. The oxidation process temperature was 600° C., and the other oxidation process conditions were set within the oxidation process condition ranges of the step 3 of the above-described embodiment.

Figure 13:
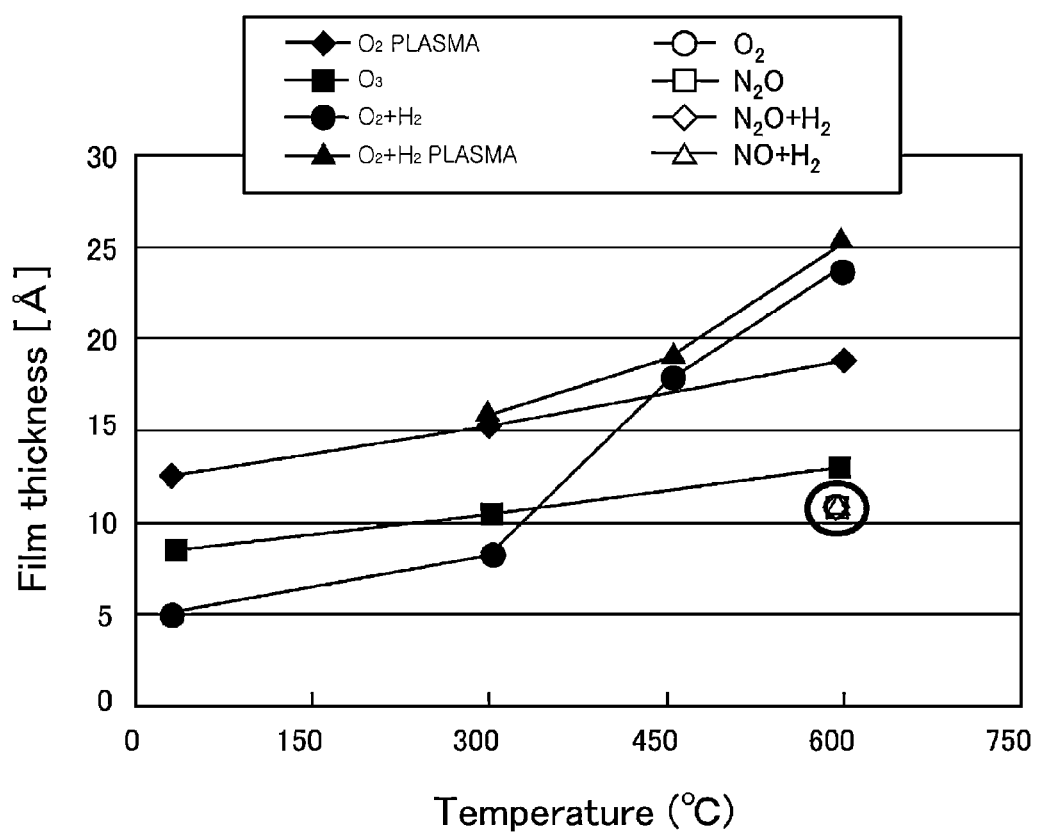
FIG. 13 is a graph showing the relationship between the film thickness of the silicon oxide film and the temperature of the wafer.

The results are illustrated in FIG. 13. FIG. 13 is a graph showing the relationship between the film thickness of the silicon oxide film and the oxidation process temperature (temperature of the wafer). In FIG. 13, the horizontal axis represents the oxidation process temperature (° C.), and the vertical axis represents the film thickness (Å) of the silicon oxide film. In FIG. 13, the white square (□) represents the oxidized amount by the $N_2O$ oxidation process, the white rhombus (◇) represents the oxidized amount by the $N_2O+H_2$ oxidation process, and the white triangle (△) represents the oxidized amount by the $NO+H_2$ oxidation process. Also, in FIG. 13, the experimental results of FIG. 12 are shown together for comparison. That is, the black circle (•), the black triangle (▲), the black rhombus (♦), the black square (■), and the white circle (○) represent the oxidized amount by the $O_2+H_2$-added oxidation process, the oxidized amount by the $O_2+H_2$-added plasma oxidation process, the oxidized amount by the $O_2$ plasma oxidation process, the oxidized amount by the $O_3$ oxidation process, and the oxidized amount by the $O_2$ oxidation process, respectively.

It can be seen from FIG. 13 that even though $H_2$ is added to $N_2O$ or NO, the oxidizing power is not improved, and it is substantially equal to the oxidizing power by the $O_2$ oxidation process performed with $O_2$ alone or the oxidizing power by the $N_2O$ oxidation process performed with $N_2O$ alone. Also, it can be seen that the same tendency is exhibited when the oxidation process temperature is 300° C., 450° C., 650° C., and 700° C.

From these aspects, in such temperature zones, there is no effect of the oxidizing power improvement even though $N_2O$ or NO is used as the oxygen-containing gas, and the oxygen-containing gas containing no nitrogen (gas that does not contain nitrogen but contains oxygen) needs to be used for obtaining the effect of the oxidizing power improvement. As the oxygen-containing gas containing no nitrogen, a material composed of oxygen atoms alone such as $O_3$ as well as $O_2$ may be used. Meanwhile, as described above in the fifth embodiment, gas obtained by activating $O_2$ with plasma may be used as the oxygen-containing gas.

Seventh Embodiment

Next, a seventh embodiment will be described.

A silicon oxide film was formed by the sequence of the current embodiment, and its within-film impurity concentration was measured. Meanwhile, comparison of the within-film impurity concentration, especially N concentration, was carried out with respect to the case of using $N_2$ gas as the purge gas and the case of using Ar gas as the purge gas. In the each step of the sequence of the current embodiment, the film-forming temperature was constant at 600° C., and the other film-forming conditions (process condition in each step) were set within the condition ranges of the above-described embodiment. Also, the measurement of impurities inside the film was carried out using SIMS.

Figure 14B:
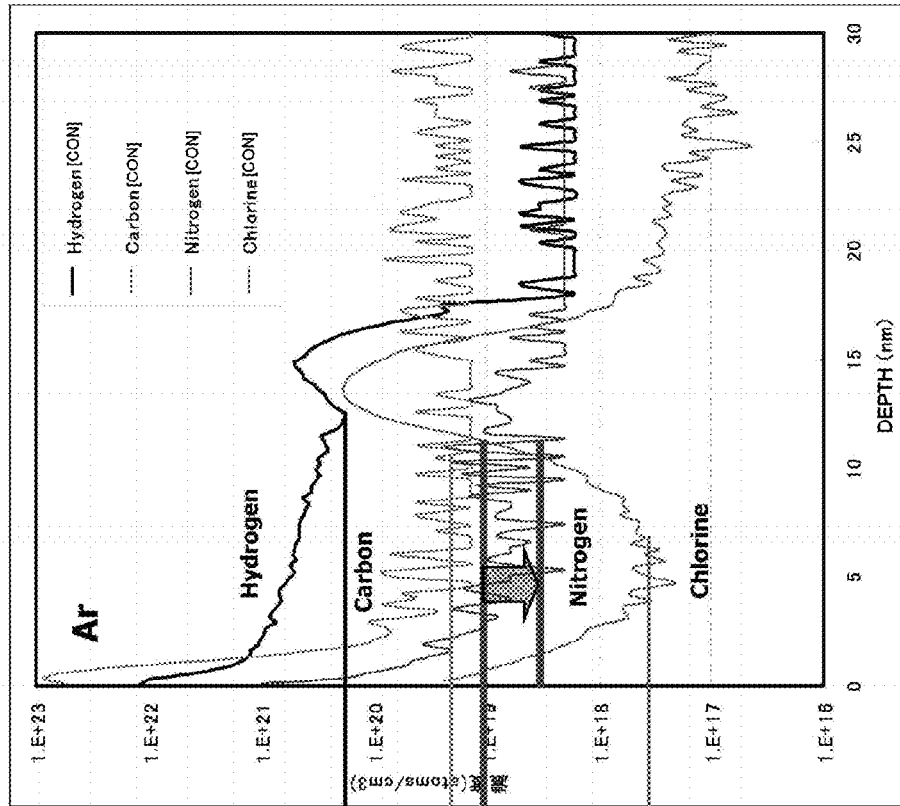
FIG. 14B is a graph illustrating the concentrations of impurities (H, C, N, Cl) contained within the silicon oxide film when Ar gas is used as a purge gas.
Figure 14A:
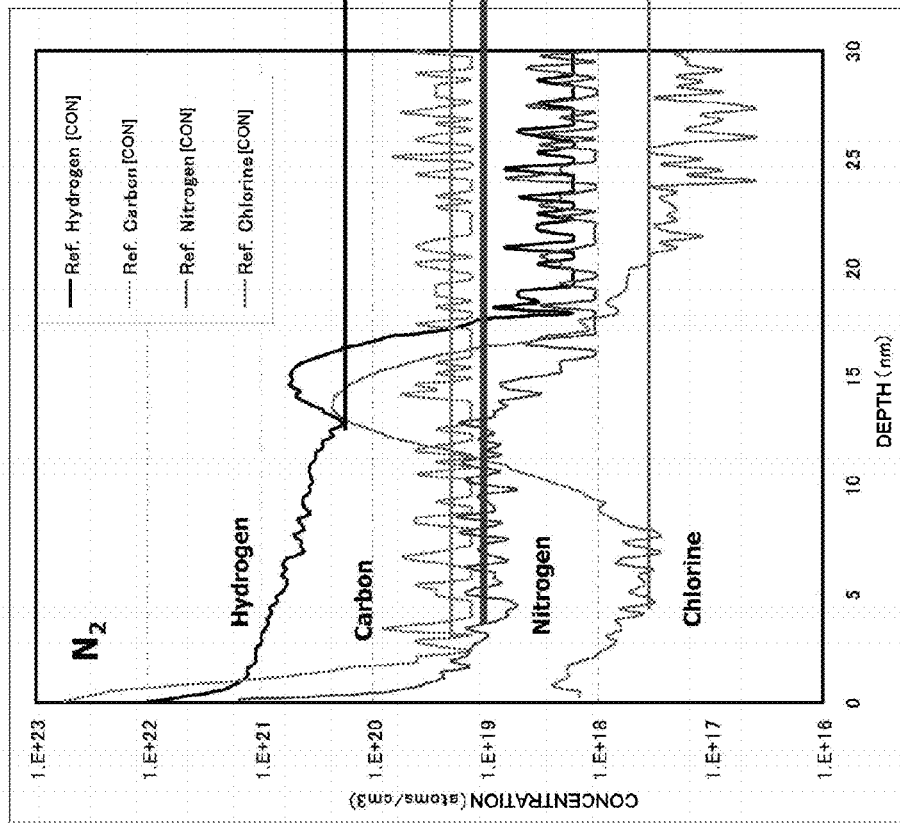
FIG. 14A is a graph illustrating the concentrations of impurities (H, C, N, Cl) contained within the silicon oxide film when $N_2$ gas is used as a purge gas.

The results are illustrated in FIGS. 14A and 14B. FIG. 14A illustrates the concentrations of impurities (H, C, N, Cl) contained inside the silicon oxide film when $N_2$ gas is used as a purge gas. FIG. 14B illustrates the concentrations of impurities (H, C, N, Cl) contained inside the silicon oxide film when Ar gas is used as a purge gas. In FIG. 14A and FIG. 14B, the horizontal axis represents the depth (nm) from the surface of the $SiO_2$ film, and the vertical axis represents the concentration (atoms/$cm^3$) of H, C, N, and Cl.

As illustrated in FIGS. 14A and 14B, it can be seen that the case of using Ar gas as the purge gas can further reduce N concentration of the silicon oxide film, compared with the case of using $N_2$ gas as the purge gas. Meanwhile, in a certain process condition, it could be confirmed that N concentration became a background level (no detection).

The silicon oxide film formed by the sequence of the current embodiment, as described above, has a small amount of impurity and has superior quality, compared with the silicon oxide film (HTO film) formed by the general CVD method, and it may be applied to IPD or SWS process of the semiconductor manufacturing processes by taking advantage of those characteristics.

In addition, in a case where a silicon oxide film is formed using general amine-based materials such as 3DMAS or BTBAS, a large amount of C or N impurity exists inside the formed silicon oxide film. In this case, a Si-containing layer is formed on a wafer by supplying an amine-based source gas to the wafer, and the Si-containing layer is nitrided by supplying a nitrogen-containing gas activated with plasma or heat to the Si-containing layer. In this way, the Si-containing layer is once changed to a SiN layer. The SiN layer is changed to an SiO layer by supplying an oxygen-containing gas activated with plasma or the like to the SiN layer. By repeating the above processes, an SiO film is formed. Even in this case, impurities such as N easily remain inside the SiO film. According to the sequence of the current embodiment, even in the case of using the amine-based source, an SiO film with a small amount of N and C impurities inside the film may be formed. Also, as described above, it is possible to form the SiO film having the Cl impurity lower by three digits than the SiO film (HTO film) formed by the general CVD method. Furthermore, in the case of using the method that forms the Si-containing layer on the wafer by supplying the source gas to the wafer, once changes the Si-containing layer to the SiN layer by nitriding the Si-containing layer through the supply of the nitrogen-containing gas activated with plasma or heat to the Si-containing layer, changes the SiN layer to the SiO layer by oxidizing the SiN layer through the supply of the oxygen-containing gas activated with plasma or the like to the SiN layer, and forms the SiO film by repeating the above processes, the oxidation process in the step 3 of the sequence of the current embodiment may be performed when the SiN layer is oxidized and changed to the SiO layer. In such a case, the SiO film having a small amount of N and C impurities inside the film can be formed.

Also, in the processing of a gate, for example, after etching a sidewall of a gate, recovery oxidation/selective oxidation by plasma oxidation or high-temperature depressurized oxidation is performed and then an SiO film as a sidewall spacer is deposited by an ALD method or a CVD method. It was confirmed that, using the sequence of the current embodiment, the recovery oxidation and the deposition of the SiO film as the sidewall spacer could be continuously performed in-situ by optimizing the hydrogen supply amount and time among the oxidation process conditions of the step 3.

Furthermore, it is required to deposit the SiO film, without oxidizing the SiN film used as a barrier film. In this case, using the sequence of the current embodiment, the hydrogen supply condition or the oxidation process time in the step 3 may be optimized, and then, the SiO film may be deposited under the condition that oxidizes only the Si source supplied in the step 1. Moreover, if the rate is required in this case, the SiO film may be deposited under soft conditions to the extent that does not affect the underlying SiN film, and then, the SiO film may be formed under a condition of a fast rate, that is, a condition of a strong oxidizing power. That is, using the sequence of the current embodiment, the SiO film may be formed in two steps: first process (initial film-forming process) of forming a first SiO film on an underlying SiN film under a soft condition of a slow rate, and a second process (main film-forming process) of forming a second SiO film under a condition of a fast rate.

Also, in forming STI liner and embedding, the diffusion-based oxidation and the CVD-based SiO film formation are separately performed. Using the sequence of the current embodiment, they can be continuously performed by changing the conditions of each step, including the film-forming temperature, to in-situ.

Furthermore, a higher-quality SiO film may be formed by performing a process of modifying the film quality of the SiO film, such as the high-temperature oxidation and annealing to the SiO film after forming the SiO film by the sequence of the current embodiment.

Moreover, explanation has been given on the example of forming the Si-containing layer in the step 1 and finally forming the SiO film, in the sequence of the current embodiment. Instead of the Si-containing layer (layer containing semiconductor element), a layer containing metal element such as Ti, Al, and Hf may be formed and then a metal oxide film may be finally formed. For example, in the case of forming a TiO film, a Ti-containing layer (Ti source adsorption layer or Ti layer) is formed on a wafer in the step 1, and the Ti-containing layer is changed to a TiO layer in the step 3. Also, for example, in the case of forming an AlO film, an Al-containing layer (Al source adsorption layer or Al layer) is formed on a wafer in the step 1, and the Al-containing layer is changed to an AlO layer in the step 3. Also, for example, in the case of forming an HfO film, an Hf-containing layer (Hf source adsorption layer or Hf layer) is formed on a wafer in the step 1, and the Hf-containing layer is changed to an HfO layer in the step 3. As such, the sequence of the current embodiment may also be applied to the process of forming metal oxides. That is, the sequence of the current embodiment may also be applied to the case where a predetermined element is a metal element as well as the case where the predetermined element is a semiconductor element.

However, in order to perform the oxidation process of the step 3, that is, in order to generate the oxidizing species containing O such as atomic oxygen by reacting oxygen-containing gas with hydrogen-containing gas under the heated depressurized atmosphere and then perform the oxidation process by using the oxidizing species, at least the temperature inside the process chamber (temperature of the wafer) must be 350° C. or more. At the temperature of less than 350° C., the oxidation process is not performed sufficiently.

Figure 15A:
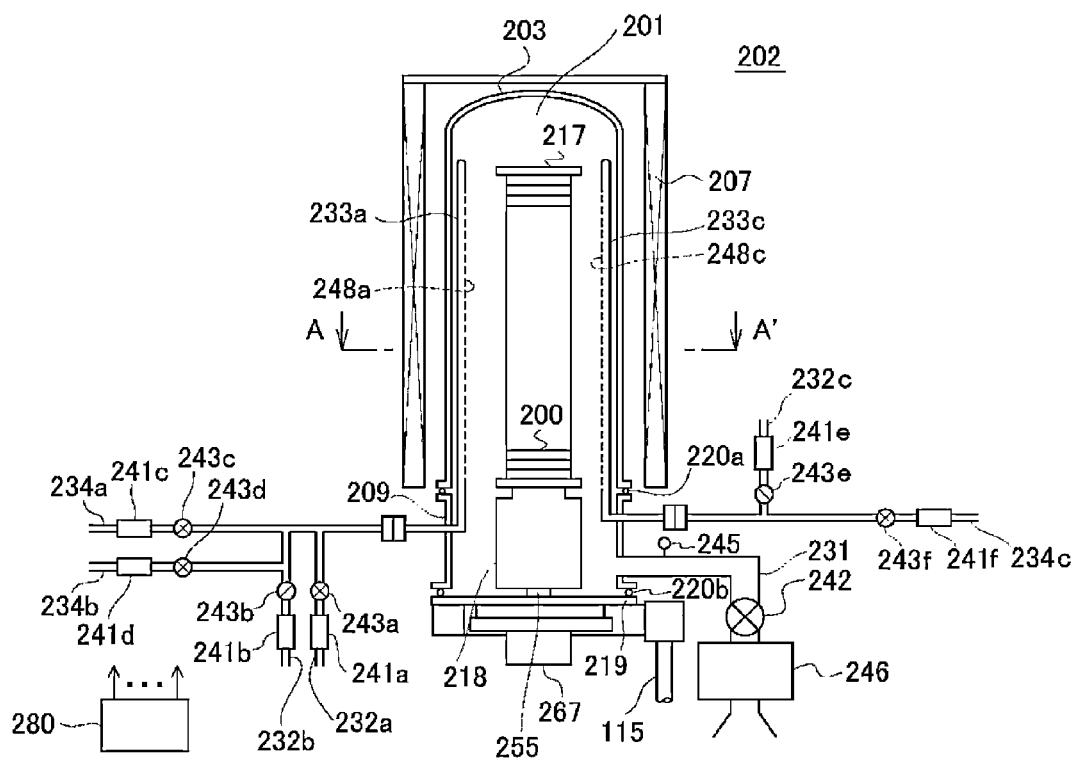
FIG. 15A is a schematic configuration view of a vertical type process furnace of a substrate processing apparatus that is preferably used in another embodiment of the present invention.
Figure 15B:
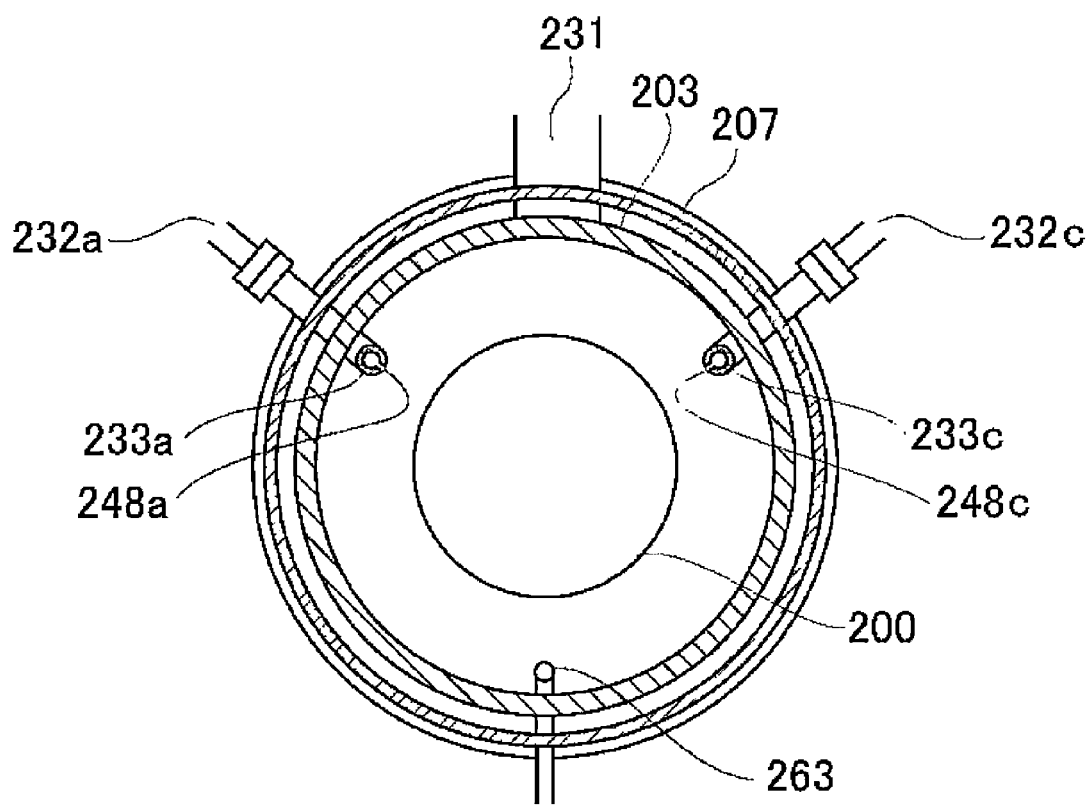
FIG. 15B is an A-A' sectional view of the process furnace illustrated in FIG. 15A.

In the above embodiment, explanation has been given on the example of supplying the $O_2$ gas, the $H_2$ gas, and the HCD gas into the process chamber 201 through the different nozzles. As illustrated in FIGS. 15A and 15B, the $O_2$ gas and the $H_2$ gas may be supplied into the process chamber 201 through the same nozzle.

FIG. 15A is a schematic configuration view of a vertical type process furnace of a substrate processing apparatus that is suitably used in another embodiment of the present invention, specifically illustrating a longitudinal sectional view of a process furnace 202. Also, FIG. 15B is an A-A' sectional view of the process furnace 202 illustrated in FIG. 15A.

The substrate processing apparatus of the current embodiment is different from the substrate processing apparatus of FIG. 1 and FIG. 2 in that a nozzle 233a is commonly used instead of the first nozzle 233a and the second nozzle 233b of FIG. 1 and FIG. 2, and a second gas supply pipe 232b is connected to a first gas supply pipe 232a. The other points are identical to those of FIG. 1 and FIG. 2. Meanwhile, in FIGS. 15A and 15B, the same symbols are assigned to the substantially same elements as those described in FIG. 1 and FIG. 2, and their description will be omitted.

In the current embodiment, $O_2$ gas and $H_2$ gas are mixed within the first gas supply pipe 232a and the nozzle 233a and supplied into the process chamber 201. In this case, the inside of the nozzle 233a is heated to the same temperature as the inside of the process chamber 201. Therefore, the $O_2$ gas and the $H_2$ gas react with each other within the nozzle 233a that is under a pressure atmosphere less than the atmospheric pressure, and oxidizing species containing oxygen is generated within the nozzle 233a. Furthermore, the pressure inside the nozzle 233a is higher than the pressure inside the process chamber 201. Hence, the reaction of the $O_2$ gas and the $H_2$ gas within the nozzle 233a is accelerated, and a lager amount of oxidizing species is generated by the reaction of the $O_2$ gas and the $H_2$ gas, thereby further improving oxidizing power is obtained. Moreover, since the $O_2$ gas and the $H_2$ gas are uniformly mixed within the nozzle 233a before being supplied into the process chamber 201, the $O_2$ gas and the $H_2$ gas uniformly react with each other within the nozzle 233a, and the concentration of the oxidizing species becomes uniform, whereby the oxidizing power between the wafers 200 becomes uniform.

In these aspects, it is preferable that the $O_2$ gas and the $H_2$ gas are supplied into the process chamber 201 through the same nozzle in order to obtain the effect of high oxidizing power improvement and the effect of oxidizing power uniformity.

The method of manufacturing the semiconductor device and the substrate processing apparatus in accordance with the embodiments of the present invention are capable of forming the insulation film having extremely low impurity concentrations of carbon, hydrogen, nitrogen, chlorine and so on inside the film at a low temperature The following description will be made on complementary notes of preferred embodiments of the present invention.

In accordance with an embodiment of the present invention, there is provided a method of manufacturing a semiconductor device, the method including: forming an oxide film having a predetermined film thickness on a substrate by repeating a process of forming a predetermined element-containing layer on the substrate by supplying source gas containing a predetermined element into a process vessel accommodating the substrate, and a process of changing the predetermined element-containing layer to an oxide layer by supplying oxygen-containing gas and hydrogen-containing gas into the process vessel that is set below atmospheric pressure, wherein the oxygen-containing gas is oxygen gas or ozone gas, the hydrogen-containing gas is hydrogen gas or deuterium gas, and the temperature of the substrate is in a range from 400° C. or more to 700° C. or less in the process of forming the oxide film.

Preferably, the temperature of the substrate is in a range from 450° C. or more to 700° C. or less in the process of forming the oxide film.

Preferably, the temperature of the substrate is in a range from 450° C. or more to 650° C. or less in the process of forming the oxide film.

Preferably, the temperature of the substrate is kept at a constant temperature in the process of forming the oxide film.

Preferably, in the process of changing the predetermined element-containing layer to the oxide layer, the oxygen-containing gas and the hydrogen-containing gas are supplied through the same nozzle.

Preferably, in the process of changing the predetermined element-containing layer to the oxide layer, oxidizing species containing oxygen is generated by reacting the oxygen-containing gas with the hydrogen-containing gas within the process vessel that is under a pressure atmosphere less than the atmospheric pressure, and the predetermined element-containing layer is oxidized by the oxidizing species and changed to the oxide layer.

Preferably, the predetermined element is a semiconductor element or a metal element.

Preferably, while repeating the process of forming the predetermined element-containing layer and the process of changing the predetermined element-containing layer to the oxide layer, the inside of the process vessel is gas-purged by using inert gas containing no nitrogen.

Preferably, the inert gas containing no nitrogen is a rare gas.

Preferably, in the process of forming the predetermined element-containing layer, the hydrogen-containing gas is supplied into the process vessel together with the source gas.

Preferably, in the process of forming the oxide film, the hydrogen-containing gas is always supplied into the process vessel.

Preferably, the oxygen-containing gas is oxygen gas, and the hydrogen-containing gas is hydrogen gas.

In accordance with another embodiment of the present invention, there is provided a method of manufacturing a semiconductor device, the method including: forming a silicon oxide film having a predetermined film thickness on a substrate by repeating a process of forming a silicon-containing layer on the substrate by supplying source gas containing silicon into a process vessel accommodating the substrate, and a process of changing the silicon-containing layer to a silicon oxide layer by supplying oxygen-containing gas and hydrogen-containing gas into the process vessel that is set below atmospheric pressure, wherein the oxygen-containing gas is oxygen gas or ozone gas, the hydrogen-containing gas is hydrogen gas or deuterium gas, and the temperature of the substrate is in a range from 400° C. or more to 700° C. or less in the process of forming the silicon oxide film.

In accordance with another embodiment of the present invention, there is provided a method of manufacturing a semiconductor device, the method including: forming a silicon oxide film having a predetermined film thickness on a substrate by repeating a process of forming a silicon-containing layer on the substrate by supplying source gas containing silicon into a process vessel accommodating the substrate where a film containing silicon atoms and a film containing metal atoms on the surface thereof are exposed, and a process of changing the silicon-containing layer to a silicon oxide layer by supplying oxygen-containing gas and hydrogen-containing gas into the process vessel that is set below atmospheric pressure, such that a supply flow rate of the hydrogen-containing gas is higher than a supply flow rate of the oxygen-containing gas, wherein the oxygen-containing gas is oxygen gas or ozone gas, the hydrogen-containing gas is hydrogen gas or deuterium gas, and the temperature of the substrate is in a range from 400° C. or more to 700° C. or less in the process of forming the silicon oxide film.

Preferably, the film containing the metal atoms is a tungsten film.

In accordance with another embodiment of the present invention, there is provided a substrate processing apparatus including: a process vessel configured to accommodate a substrate; a heater configured to heat the inside of the process vessel; a source gas supply system configured to supply source gas containing a predetermined element into the process vessel; an oxygen-containing gas supply system configured to supply oxygen gas or ozone gas as the oxygen-containing gas into the process vessel; a hydrogen-containing gas supply system configured to supply hydrogen gas or deuterium gas as the hydrogen-containing gas into the process vessel; a pressure regulation unit configured to regulate pressure inside the process vessel; and a controller configured to control the source gas supply system, the oxygen-containing gas supply system, the hydrogen-containing gas supply system, the pressure regulation unit, and the heater to so that an oxide film having a predetermined film thickness is formed on the substrate by repeating a process of forming a predetermined element-containing layer on the substrate by supplying the source gas into the process vessel accommodating the substrate, and a process of changing the predetermined element-containing layer to an oxide layer by supplying the oxygen-containing gas and the hydrogen-containing gas into the process vessel that is set below atmospheric pressure, and so that the temperature of the substrate is set in a range from 400° C. or more to 700° C. or less when forming the oxide film.

In accordance with another embodiment of the present invention, there is provided a substrate processing apparatus including: a process vessel configured to accommodate a substrate; a heater configured to heat the inside of the process vessel; a source gas supply system configured to supply source gas containing silicon into the process vessel; an oxygen-containing gas supply system configured to supply oxygen gas or ozone gas as the oxygen-containing gas into the process vessel; a hydrogen-containing gas supply system configured to supply hydrogen gas or deuterium gas as the hydrogen-containing gas into the process vessel; a pressure regulation unit configured to regulate pressure inside the process vessel; and a controller configured to control the source gas supply system, the oxygen-containing gas supply system, the hydrogen-containing gas supply system, the pressure regulation unit, and the heater so that a silicon oxide film having a predetermined film thickness is formed on the substrate by repeating a process of forming a silicon-containing layer on the substrate by supplying the source gas into the process vessel accommodating the substrate, and a process of changing the silicon-containing layer to a silicon oxide layer by supplying the oxygen-containing gas and the hydrogen-containing gas into the process vessel that is set below atmospheric pressure, and so that the temperature of the substrate is set in a range from 400° C. or more to 700° C. or less when forming the silicon oxide film.

In accordance with another embodiment of the present invention, there is provided a substrate processing apparatus including: a process vessel configured to accommodate a substrate; a heater configured to heat the inside of the process vessel; a source gas supply system configured to supply source gas containing silicon into the process vessel; an oxygen-containing gas supply system configured to supply oxygen gas or ozone gas as the oxygen-containing gas into the process vessel; a hydrogen-containing gas supply system configured to supply hydrogen gas or deuterium gas as the hydrogen-containing gas into the process vessel; a pressure regulation unit configured to regulate pressure inside the process vessel; and a controller configured to control the source gas supply system, the oxygen-containing gas supply system, the hydrogen-containing gas supply system, the pressure regulation unit, and the heater so that a silicon oxide film having a predetermined film thickness is formed on the substrate by repeating a process of forming a silicon-containing layer on the substrate by supplying the source gas into the process vessel accommodating the substrate where a film containing silicon atoms and a film containing metal atoms on the surface thereof are exposed, and a process of changing the silicon-containing layer to a silicon oxide layer by supplying the oxygen-containing gas and the hydrogen-containing gas into the process vessel that is set below atmospheric pressure, such that a supply flow rate of the hydrogen-containing gas is higher than a supply flow rate of the oxygen-containing gas, and so that the temperature of the substrate is set in a range from 400° C. or more to 700° C. or less when forming the silicon oxide film.

Preferably, the substrate processing apparatus further includes a common nozzle configured to supply the oxygen-containing gas, which is supplied from the oxygen-containing gas supply system, and the hydrogen-containing gas, which is supplied from the hydrogen-containing gas supply system, into the process vessel.

What is claimed is:

1. A method of manufacturing a semiconductor device, the method comprising:
forming an oxide film having a predetermined thickness on a substrate by alternately repeating:
(a) forming an element-containing layer on the substrate by supplying a source gas containing an element into a process vessel accommodating the substrate through a first nozzle; and
(b) changing the element-containing layer to an oxide layer by: simultaneously supplying an oxygen-containing gas through a second nozzle different from the first nozzle and a hydrogen-containing gas through the first nozzle into the process vessel having an inside pressure lower than atmospheric pressure; mixing and reacting the oxygen-containing gas with the hydrogen-containing gas in a non-plasma atmosphere within the process vessel to generate an atomic oxygen; and oxidizing the element-containing layer by the atomic oxygen;
wherein the steps (a) and (b) are performed while heating the substrate, an inside of the process vessel, an inside of the first nozzle and an inside of the second nozzle to a temperature equal to a film-forming temperature.

2. The method of claim 1, wherein the temperature ranges from 400° C. to 700° C.

3. The method of claim 1, wherein the temperature ranges from 450° C. to 700° C.

4. The method of claim 1, wherein the temperature ranges from 450° C. to 650° C.

5. The method of claim 1, wherein the oxygen-containing gas comprises oxygen gas or ozone gas and the hydrogen-containing gas comprises hydrogen gas or deuterium gas.

6. The method of claim 2, wherein the oxygen-containing gas comprises oxygen gas or ozone gas and the hydrogen-containing gas comprises hydrogen gas or deuterium gas.

7. The method of claim 1, wherein the step (a) comprises forming the element-containing layer of several atomic layers on the substrate via a CVD method by supplying the source gas containing the element into the process vessel accommodating the substrate under a condition where the source gas is self-decomposed.

8. The method of claim 1, further comprising (c) gas-purging an inside of the process vessel using an inert gas while alternately repeating the steps (a) and (b).

9. The method of claim 1, further comprising (c) gas-purging an inside of the process vessel using an inert gas containing no nitrogen while alternately repeating the steps (a) and (b).

10. The method of claim 9, wherein the inert gas is a rare gas.

11. The method of claim 1, wherein the element is a semiconductor element or a metal element.

12. The method of claim 1, wherein the element comprises silicon.

13. A method of manufacturing a semiconductor device, the method comprising:
forming an oxide film having a predetermined thickness on a substrate by alternately repeating:

(a) forming an element-containing layer on the substrate by supplying a source gas containing an element into a process vessel accommodating the substrate through a first nozzle; and (b) changing the element-containing layer to an oxide layer by: simultaneously supplying an oxygen-containing gas and a hydrogen-containing gas into the process vessel having an inside pressure lower than atmospheric pressure through a second nozzle different from the first nozzle after mixing the oxygen-containing gas with the hydrogen-containing gas within the second nozzle having an inside pressure lower than the atmospheric pressure; reacting the oxygen-containing gas with the hydrogen-containing gas in a non-plasma atmosphere to generate an atomic oxygen; and oxidizing the element-containing layer by the atomic oxygen, wherein the steps (a) and (b) are performed while heating the substrate, an inside of the process vessel, an inside of the first nozzle and an inside of the second nozzle to a temperature equal to a film-forming temperature.

14. The method of claim 13, wherein the oxygen-containing gas is reacted with the hydrogen-containing gas within the second nozzle having the inside pressure lower than the atmospheric pressure to generate the atomic oxygen within the second nozzle, and the element-containing layer is oxidized into the oxide layer by the atomic oxygen in the step (b).

15. The method of claim 13, wherein the oxygen-containing gas is reacted with the hydrogen-containing gas within the second nozzle and the process vessel having inside pressures lower than the atmospheric pressure to generate the atomic oxygen within the second nozzle and the process vessel, and the element-containing layer is oxidized into the oxide layer by the atomic oxygen in the step (b).

16. A method of manufacturing a semiconductor device, the method comprising:

forming an oxide film having a predetermined thickness on a substrate by alternately repeating:

(a) forming an element-containing layer of several atomic layers on the substrate by supplying a source gas containing an element into the process vessel accommodating the substrate through a first nozzle under a condition where the source gas is self-decomposed;

(b) changing the element-containing layer to an oxide layer by: simultaneously supplying an oxygen-containing gas through a second nozzle different from the first nozzle and a hydrogen-containing gas through the first nozzle into the process vessel having an inside pressure lower than atmospheric pressure; mixing and reacting the oxygen-containing gas with the hydrogen-containing gas in a non-plasma atmosphere within the process vessel to generate an atomic oxygen; and oxidizing the element-containing layer by the atomic oxygen, wherein the steps (a) and (b) are performed while heating the substrate, an inside of the process vessel, an inside of the first nozzle and an inside of the second nozzle to a temperature equal to a film-forming temperature.

17. A method of manufacturing a semiconductor device, the method comprising:

forming a silicon oxide film having a predetermined thickness on a substrate by alternately repeating:

(a) forming a silicon layer of several atomic layers on the substrate by supplying a source gas containing silicon into a process vessel accommodating the substrate through a first nozzle under a condition where the source gas is self-decomposed; and (b) changing the silicon layer to a silicon oxide layer by: simultaneously supplying an oxygen-containing gas through a second nozzle different from the first nozzle and a hydrogen-containing gas through the first nozzle into the process vessel having an inside pressure lower than atmospheric pressure; mixing and reacting the oxygen-containing gas with the hydrogen-containing gas in a non-plasma atmosphere within the process vessel to generate an atomic oxygen; and oxidizing the silicon layer by the atomic oxygen, wherein the steps (a) and (b) are performed while heating the substrate, an inside of the process vessel, an inside of the first nozzle and an inside of the second nozzle to a temperature equal to a film-forming temperature.

18. The method of claim 1, wherein the temperature ranges from 400° C. to 600° C.

19. The method of claim 1, wherein the element-containing layer comprises a Si—Si bond and a Si—O bond, and the step (b) is performed without generating an energy capable of breaking the Si—Si bond and the Si—O bond.

20. The method of claim 1, wherein the element-containing layer comprises a Si—Si bond and a Si—Cl bond, and the step (b) comprises supplying the element-containing layer with an energy capable of breaking the Si—Cl bond without breaking the Si—Si bond.

21. The method of claim 1, wherein the element-containing layer comprises a Si—Si bond, a Si—H bond and a Si—Cl bond, and the step (b) comprises supplying the element-containing layer with an energy capable of breaking the Si—H bond and the Si—Cl bond without breaking the Si—Si bond.

22. The method of claim 1, wherein the element-containing layer comprises a Si—Si bond, a Si—N bond, a Si—H bond and a Si—C bond, and the step (b) comprises supplying the element-containing layer with an energy capable of breaking the Si—N bond, the Si—H bond and the Si—C bond without breaking the Si—Si bond.

23. The method of claim 1, wherein the element-containing layer comprises a Si—Si bond, a Si—O bond and a Si—Cl bond, and the step (b) comprises supplying the element-containing layer with an energy capable of breaking the Si—Cl bond without breaking the Si—Si bond and the Si—O bond.

24. The method of claim 1, wherein the element-containing layer comprises a Si—Si bond, a Si—Cl bond, a Si—N bond, a Si—H bond and a Si—C bond, and the step (b) comprises supplying the element-containing layer with an energy capable of breaking the Si—Cl bond, the Si—N bond, the Si—H bond and the Si—C bond without breaking the Si—Si bond.

25. The method of claim 1, wherein the element-containing layer comprises a Si—Si bond, a Si—O bond, a Si—Cl bond, a Si—N bond, a Si—H bond and a Si—C bond, and the step (b) comprises supplying the element-containing layer with an energy capable of breaking the Si—Cl bond, the Si—N bond, the Si—H bond and the Si—C bond without breaking the Si—Si bond and the Si—O bond.

* * * * *